US009905458B2

(12) United States Patent
Siew et al.

(10) Patent No.: US 9,905,458 B2
(45) Date of Patent: Feb. 27, 2018

(54) METHODS OF FABRICATING A SEMICONDUCTOR DEVICE HAVING A VIA STRUCTURE AND AN INTERCONNECTION STRUCTURE

(71) Applicants: Yongkong Siew, Suwon-si (KR); Seongho Park, Suwon-si (KR)

(72) Inventors: Yongkong Siew, Suwon-si (KR); Seongho Park, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 263 days.

(21) Appl. No.: 14/802,086

(22) Filed: Jul. 17, 2015

(65) Prior Publication Data

US 2016/0163586 A1    Jun. 9, 2016

(30) Foreign Application Priority Data

Dec. 3, 2014    (KR) ........................ 10-2014-0172284

(51) Int. Cl.
*H01L 21/768*    (2006.01)
*H01L 23/522*    (2006.01)
*H01L 23/532*    (2006.01)

(52) U.S. Cl.
CPC .. *H01L 21/76844* (2013.01); *H01L 21/76847* (2013.01); *H01L 21/76849* (2013.01);
(Continued)

(58) Field of Classification Search
CPC ........... H01L 21/76844; H01L 23/5226; H01L 23/53238; H01L 21/76879;
(Continued)

(56) References Cited

U.S. PATENT DOCUMENTS

| 4,692,349 A | 9/1987 | Georgiou et al. |
| 5,904,565 A * | 5/1999 | Nguyen ............ H01L 21/76801 |
| | | 257/E21.168 |

(Continued)

FOREIGN PATENT DOCUMENTS

| JP | 2014135465 A | 7/2014 |
| KR | 20100109035 A | 10/2010 |

OTHER PUBLICATIONS

Y.K. Diew et al., "CVD Mn-based Self-Formed Barrier for Advanced Interconnect Technology" published in Interconnect Technology Conference (IITC), 2013 IEEE International on Jun. 13-15, 2013.

(Continued)

*Primary Examiner* — John P Dulka
(74) *Attorney, Agent, or Firm* — Harness, Dickey & Pierce, P.L.C.

(57) ABSTRACT

Methods of fabricating a semiconductor device include forming a lower interlayer insulating layer and a conductive base structure, and forming a middle interlayer insulating layer covering the lower interlayer insulating layer and the conductive base structure. The methods include etching the middle interlayer insulating layer to form a via hole and an interconnection trench vertically aligned with the via hole, and forming a via barrier layer on inner walls of the via hole and an interconnection barrier layer on inner walls and a bottom of the interconnection trench, the via barrier layer not being formed on an upper surface of the conductive base structure The methods include forming a via plug on the via barrier layer to fill the via hole, forming a seed layer on the interconnection trench and the via plug, forming an interconnection electrode on the seed layer, and forming an interconnection capping layer on the interconnection electrode.

20 Claims, 23 Drawing Sheets

(52) U.S. Cl.
CPC .... *H01L 21/76879* (2013.01); *H01L 23/5226* (2013.01); *H01L 23/53238* (2013.01); *H01L 23/53266* (2013.01)

(58) Field of Classification Search
CPC ......... H01L 21/76847; H01L 21/76849; H01L 23/53266
See application file for complete search history.

(56) References Cited

U.S. PATENT DOCUMENTS

| | | | |
|---|---|---|---|
| 6,239,021 B1* | 5/2001 | Pramanick | H01L 21/76843 257/750 |
| 8,088,687 B2 | 1/2012 | Yeom et al. | |
| 8,653,665 B2 | 2/2014 | Miyoshi | |
| 2003/0134510 A1* | 7/2003 | Lee | C25D 5/022 438/674 |
| 2003/0139034 A1* | 7/2003 | Yuang | H01L 21/76801 438/634 |
| 2006/0024953 A1* | 2/2006 | Papa Rao | H01L 21/2855 438/629 |
| 2006/0046456 A1* | 3/2006 | An | H01L 21/2885 438/597 |
| 2008/0182409 A1 | 7/2008 | Seidel et al. | |
| 2009/0269507 A1 | 10/2009 | Yu et al. | |
| 2009/0304914 A1 | 12/2009 | Nalla et al. | |
| 2012/0074575 A1 | 3/2012 | Yeom et al. | |
| 2014/0161992 A1 | 6/2014 | Ishizaka et al. | |

OTHER PUBLICATIONS

C.-C. Yang et al., "Integration and Reliability of CVD Ru Cap for Cu/Low-k Development" published in Interconnect Technology Conference (IITC), 2009 IEEE International on Jun. 1-3, 2009.
Chih-Chao Yang et al. "Co Capping Layers for Cu/Low-k Interconnects" by AMC, Albany, NY, Oct. 5-7, 2010.

* cited by examiner

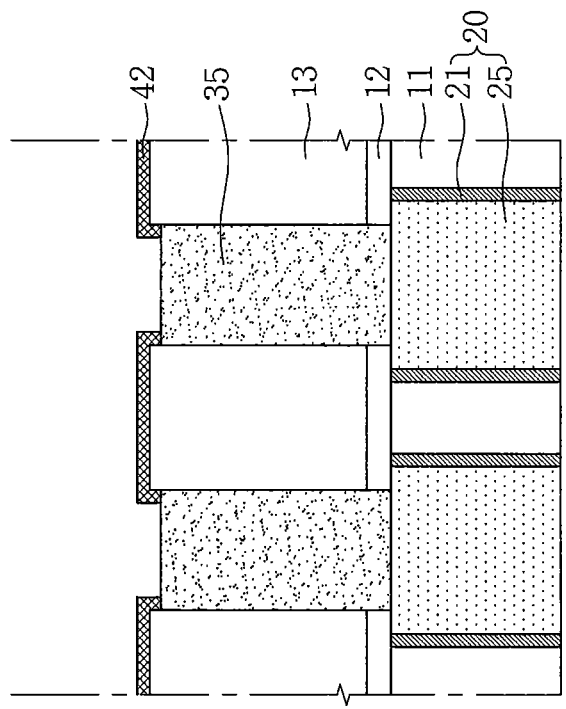
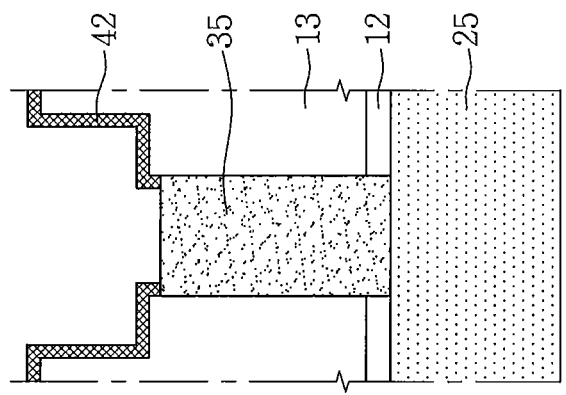

METHODS OF FABRICATING A SEMICONDUCTOR DEVICE HAVING A VIA STRUCTURE AND AN INTERCONNECTION STRUCTURE

CROSS-REFERENCE TO RELATED APPLICATION

This application claims priority to, and the benefit of, under 35 U.S.C. §119, Korean Patent Application No. 10-2014-0172284 filed on Dec. 3, 2014, the disclosure of which is hereby incorporated by reference in its entirety.

BACKGROUND

Field

Some example embodiments of the inventive concepts relate to semiconductor devices having a via structure and an interconnection structure and/or methods of fabricating the semiconductor devices. Some example embodiments of the inventive concepts relate to an apparatus for fabricating the semiconductor devices and/or method of fabricating a semiconductor device using the apparatus.

Description of Related Art

As semiconductor devices become more highly integrated, a dual damascene process to form both a via structure and an interconnection structure at the same time is widely used. However, with a high aspect ratio (AR), the dual damascene process to fill conductive materials into a deep via hole is very difficult and results in void and/or seams.

SUMMARY

Some example embodiments of the inventive concepts provide semiconductor devices having via structures and interconnection structures.

Some example embodiments of the inventive concepts provide methods of fabricating semiconductor devices having via structures and interconnection structures.

Some example embodiments of the inventive concepts provide an apparatus for fabricating semiconductor devices having via structures and interconnection structures.

Example embodiments of the inventive concepts are not limited to the above disclosure; other example embodiments may become apparent to those of ordinary skill in the art based on the following descriptions.

A method of fabricating a semiconductor device in accordance with some example embodiments of the inventive concepts includes forming a lower interlayer insulating layer and a conductive base structure, upper surfaces of the lower interlayer insulating layer and the conductive base structure being coplanar, forming a middle interlayer insulating layer covering the lower interlayer insulating layer and the conductive base structure, forming (i) a via hole vertically extending through the middle interlayer insulating layer to expose the upper surface of the conductive base structure, and (ii) an interconnection trench vertically aligned with the via hole, forming a via barrier layer on inner walls of the via hole, and an interconnection barrier layer on inner walls and a bottom of the interconnection trench, the via barrier layer not being formed on the upper surface of the conductive base structure, forming a via plug on the via barrier layer to fill the via hole, forming a seed layer on inner walls and a bottom of the interconnection trench and an upper surface of the via plug, forming an interconnection electrode on the seed layer, and forming an interconnection capping layer on the interconnection electrode.

The conductive base structure may comprise a base electrode, and a base barrier layer surrounding the base electrode.

An upper surface of the base electrode may not be covered by the base barrier layer.

The via barrier layer and the interconnection barrier layer may comprise at least one selected from TaN, TiN, and Mn.

The forming the via barrier layer may comprise conformally forming a barrier material layer on the inner walls of the via hole and the upper surface of the exposed conductive base structure; and removing the barrier material layer formed on the upper surface of the conductive base structure.

The removing the barrier material layer on the upper surface of the conductive base structure may comprise performing an Ar plasma sputtering process.

The upper surface of the via plug may be lower than the bottom of the interconnection trench.

The via plug may comprise at least one selected from Co and Ru.

The interconnection capping layer may not be formed on an upper surface of the middle interlayer insulating layer, the interconnection capping layer may protrude from an upper surface of the interconnection electrode, and the interconnection capping layer may have an upper surface higher than the upper surface of the middle interlayer insulating layer.

The interconnection capping layer may comprise at least one selected from Ru and Co.

The method may further comprise forming a lower stopper layer between the lower interlayer insulating layer and the middle interlayer insulating layer.

The method may further comprise forming an upper stopper layer on the interconnection capping layer; and forming an upper interlayer insulating layer on the upper stopper layer.

The method may further comprise conformally forming a liner layer between the interconnection barrier layer and the seed layer.

The liner layer may comprise at least one selected from Co and Ru.

A method of fabricating a semiconductor device in accordance with some example embodiments of the inventive concepts includes forming a lower interlayer insulating layer and a base structure, upper surfaces of the lower interlayer insulating layer and the base structure being coplanar, forming a lower stopper layer covering the lower interlayer insulating layer and the base structure, forming a middle interlayer insulating layer on the lower stopper layer, forming (i) a via hole vertically extending through the middle interlayer insulating layer and the lower stopper layer, and (ii) an interconnection trench vertically aligned with the via hole, forming a via plug filling the via hole, forming an interconnection barrier layer on the upper surface of the via plug and inner walls and a bottom of the interconnection trench, forming a liner layer on the interconnection barrier layer, forming a seed layer on the liner layer, forming an interconnection electrode on the seed layer, and forming an interconnection capping layer on the interconnection electrode.

A semiconductor device in accordance with some example embodiments of the inventive concepts includes a lower interlayer insulating layer surrounding sidewalls of a conductive base structure, a middle interlayer insulating layer on the lower interlayer insulating layer, a via structure extending through the middle interlayer insulating layer and connected with the conductive base structure, and an interconnection structure in the middle interlayer insulating layer, the interconnection structure being aligned with the via structure.

The via structure may include a via barrier layer on inner walls of a via hole, the via barrier layer not being formed on the upper surface of the conductive base structure, and the via hole extending through the middle interlayer insulating layer to expose an upper surface of the conductive base structure, and a via plug on the via barrier layer to fill the via hole.

The interconnection structure may include an interconnection barrier layer on inner walls and a bottom of an interconnection trench, the interconnection trench being aligned with the via hole, and an interconnection electrode on the interconnection barrier layer to fill the interconnection trench. The via barrier layer may be materially in continuity with the interconnection barrier layer.

The semiconductor device may further include a seed layer between the interconnection barrier layer and the interconnection electrode, the seed layer extending onto an upper surface of the via plug.

The semiconductor device may further include a liner layer between the seed layer and the interconnection barrier layer, the liner layer extending onto the upper surface of the via plug.

The interconnection structure may further comprise an interconnection capping layer on an upper surface of the interconnection electrode.

A bottom of the via plug and the upper surface of the conductive base structure may be in contact with each other.

A semiconductor device in accordance with some example embodiments of the inventive concepts includes a lower stopper layer and an interlayer insulating layer on a base structure, a via structure extending through both the interlayer insulating layer and the lower stopper layer to be connected with the base structure, and an interconnection structure in the interlayer insulating layer, the interconnection structure being aligned with the via structure. The via structure may include a via plug filling a via hole, the via hole extending through the interlayer insulating layer to expose an upper surface of the base structure. The interconnection structure may include an interconnection barrier layer on inner walls and a bottom of an interconnection trench, the interconnection trench being aligned with the via hole, a liner layer on the upper surfaces of the interconnection barrier layer and the via plug, a seed layer on the liner layer, and an interconnection electrode on the seed layer to fill the interconnection trench.

The interconnection barrier layer may extend between the upper surface of the via plug and the liner layer.

The liner layer may be in direct contact with the upper surface of the via plug.

The via structure may further comprise a via barrier layer surrounding sidewalls of the via plug. The via barrier layer may not be formed on the upper surface of the base structure.

The upper surface of the via plug may be lower than the bottom of the interconnection trench.

The interconnection structure may further comprise an interconnection capping layer on an upper surface of the interconnection electrode, and the interconnection capping layer protrudes from the upper surface of the interlayer insulating layer.

The base structure may comprise a base electrode, and a base barrier layer surrounding the base electrode.

The liner layer may comprise at least one selected from Co and Ru.

The via plug may comprise at least one selected from Co and Ru.

The via barrier layer and the interconnection barrier layer may be single layers or multi-layers, and the via barrier layer and the interconnection barrier layer may include at least one selected from TaN, TiN, and Mn.

A method of fabricating a semiconductor device in accordance with some example embodiments of the inventive concepts includes heating a wafer in a degassing chamber of an apparatus, the wafer having a via hole and an interconnection trench aligned with the via hole, transferring the heated wafer from the degassing chamber into a barrier depositing chamber of the apparatus to form a barrier layer on inner walls and bottoms of the via hole and the trench, transferring the wafer having the barrier layer from the barrier deposition chamber into a plasma chamber of the apparatus to treat the barrier layer using plasma, transferring the plasma-treated wafer from the plasma chamber into a CVD chamber of the apparatus to form a via plug filling the via hole, transferring the wafer having the via plug from the CVD chamber into a liner depositing chamber of the apparatus to form a liner layer, and transferring the wafer having the liner layer from the liner depositing chamber into a seed depositing chamber of the apparatus to form a seed layer on the liner layer.

The heating a wafer may comprise heating the wafer to a temperature in a range of about 300° C. to about 400° C.

The method may further include forming a single metal layer or a multi metal layer to form the barrier layer on the inner walls of the via hole and the inner walls and the bottom of the interconnection trench. The single metal layer and the multi metal layer may include at least one selected from TaN, TiN, and Mn.

The method may further comprise removing portions of the barrier layer using $H_2$ plasma or Ar plasma in the plasma chamber.

The method may further comprise heating the seed layer to reflow in the seed depositing chamber.

According to some example embodiments, a method of manufacturing a semiconductor device includes forming a middle interlayer insulating layer over a base structure, the base structure being within a lower interlayer insulating layer; etching the middle interlayer insulating layer to form (i) a via hole extending through the middle interlayer insulating layer to expose the base structure, and (ii) an interconnection trench aligned over the via hole so as to form opposing steps in conjunction with the via hole; forming a barrier layer on a bottom of the interconnection trench, the opposing steps, and at least an uppermost portion of inner walls of the via hole; forming a via plug filling the via hole; and sequentially forming a liner layer, a seed layer, an interconnection electrode and an interconnection capping layer. The liner layer, the seed layer, the interconnection electrode and the interconnection capping layer collectively fill the interconnection trench.

The forming the barrier layer may include not forming the barrier layer on a remaining portion of the inner walls of the via hole.

The forming the via plug may include performing a chemical vapor deposition process. The forming the interconnection electrode may include performing a plating process.

The forming the barrier layer may include performing a self-forming process, the self-forming process including not forming the barrier layer on an upper surface of the base structure.

The forming the barrier layer may be performed after the forming the via plug, and the barrier layer may contact an upper surface of the via plug.

Details of some example embodiments are included in the detailed description and drawings.

BRIEF DESCRIPTION OF THE DRAWINGS

Example embodiments will be more clearly understood from the following detailed description taken in conjunction with the accompanying drawings. FIGS. 1-22D represent non-limiting, example embodiments as described herein.

FIG. 1 illustrates a schematic layout of a semiconductor device in accordance with some example embodiments of the inventive concepts.

FIGS. 2A and 2B to 5A and 5B illustrate longitudinal cross-sectional views taken along I-I' and II-II' of the semiconductor device shown in FIG. 1.

FIGS. 6A and 6B to 20A and 20B illustrate longitudinal cross-sectional views describing methods of fabricating semiconductor devices in accordance with some example embodiments of the inventive concepts.

FIG. 21 is a diagram illustrating an apparatus for fabricating a semiconductor device in accordance with some example embodiments of the inventive concepts.

FIGS. 22C and 22D are block diagrams conceptually showing electronic systems and including at least one of the semiconductor devices in accordance with some example embodiments of the inventive concepts.

DETAILED DESCRIPTION OF EXAMPLE EMBODIMENTS

Figure 1:
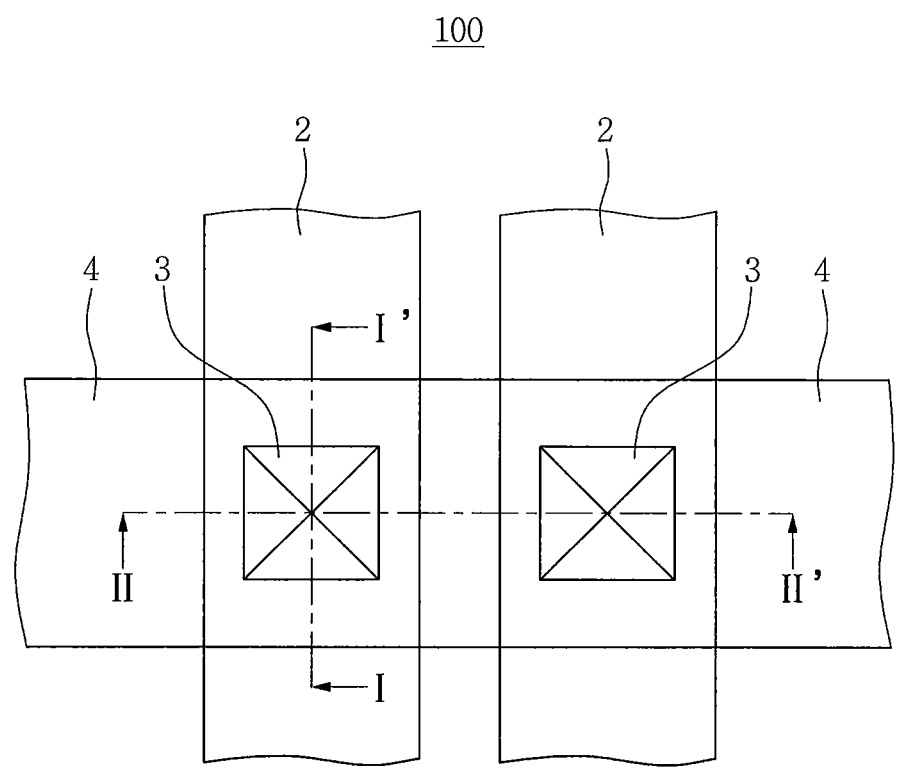

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a schematic layout of a semiconductor device in accordance with some example embodiments of the inventive concepts.

Referring to FIG. 1, a semiconductor device 100 in accordance with some example embodiments of the inventive concepts may include conductive bases 2, vias 3, and interconnections 4. For example, the bases 2 may have line shapes longitudinally extending in parallel to each other. The interconnections 4 may horizontally extend to vertically intersect the bases 2. The vias 3 may be disposed in intersecting areas of the bases 2 and the interconnections 4, respectively. In some example embodiments, the bases 2 may have an island type pad shape.

Figure 2B:
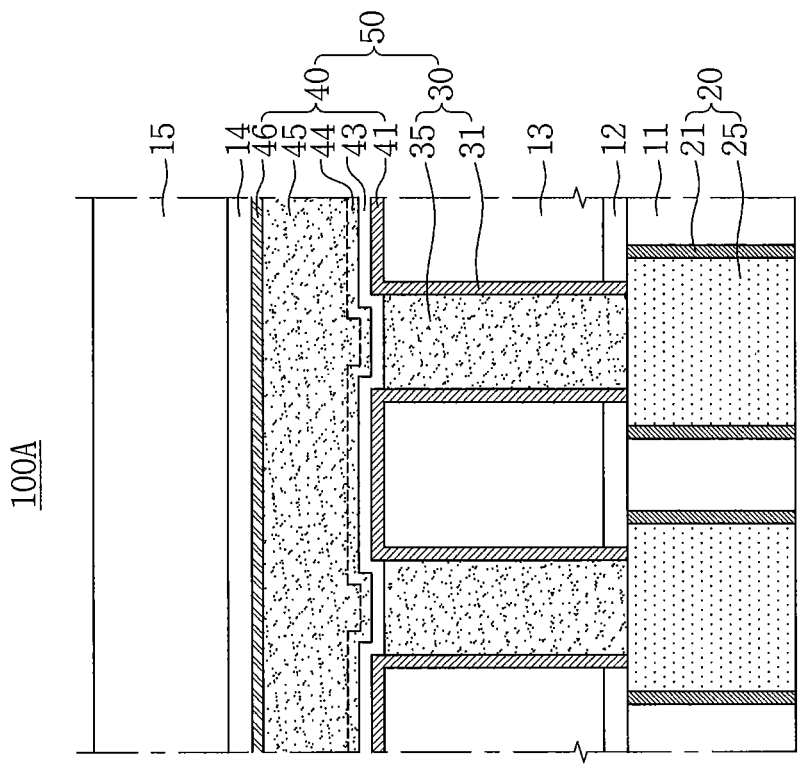
Figure 2A:
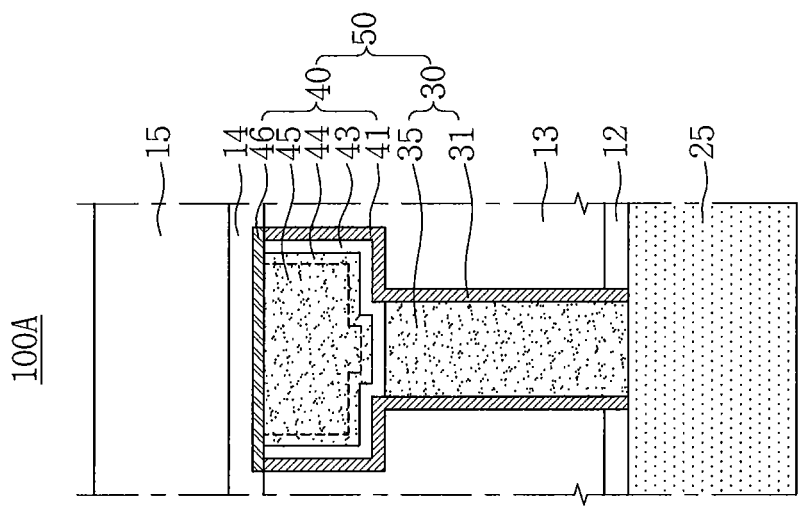

FIGS. 2A and 2B illustrate longitudinal cross-sectional views of a semiconductor device in accordance with some example embodiments of the inventive concepts.

For example, FIG. 2A illustrates a longitudinal cross-sectional view taken along I-I' of the semiconductor device shown in FIG. 1 and FIG. 2B illustrates a longitudinal cross-sectional view taken along II-II' of the semiconductor device shown in FIG. 1.

Referring to FIGS. 2A and 2B, a semiconductor device 100A in accordance with some example embodiments of the inventive concepts may include a base structure 20 and a via-interconnection structure 50.

The semiconductor device 100A may further include a lower interlayer insulating layer 11 surrounding sidewalls of the base structure 20. The lower interlayer insulating layer 11 may include a compound containing silicon and oxygen such as $SiO_2$, SiCO, or SiCOH.

The base structure 20 may include a base barrier layer 21 and a base electrode 25. The base barrier layer 21 may be conformally formed to surround sidewalls of the base electrode 25. Accordingly, the lower interlayer insulating layer 11 may surround the sidewalls of the base barrier layer 21. The base barrier layer 21 may include a metal compound such as TiN or TaN. The base electrode 25 may include W, Cu, or other metals. The base electrode 25 may have one of a line shape or a pad shape in a plan view, or one of a dam shape or a pillar shape in a cross-sectional view.

The semiconductor device 100A may further include a lower stopper layer 12 on the lower interlayer insulating layer 11 and a middle interlayer insulating layer 13 on the lower stopper layer 12. The lower stopper layer 12 may include SiN or SiCN. The lower stopper layer 12 may be in contact with the base structure 20. The middle interlayer insulating layer 13 may include a compound containing silicon and oxygen such as $SiO_2$, SiCO, or SiCOH The via-interconnection structure 50 may include a via structure 30 and an interconnection structure 40.

The via structure 30 may be connected with the base structure 20 and vertically pass (or, alternatively, extend) through the middle interlayer insulating layer 13 and the lower stopper layer 12. For example, the via structure 30 may be in contact with the base electrode 25.

The via structure 30 may include a via barrier layer 31 conformally formed on inner walls of a via hole 30H (shown in FIGS. 7A and 7B), vertically passing through the middle interlayer insulating layer 13 and the lower stopper layer 12 to expose an upper surfaces of the base electrode 25, and a via plug 35 formed on the via barrier layer 31 to fill the via hole 30H. The via barrier layer 31 may surround sidewalls of the via plug 35. The lower stopper layer 12 and the middle interlayer insulating layer 13 may surround sidewalls of the via barrier layer 31. The via barrier layer 31 may include TaN or TiN. The via plug 35 may include Co or Ru.

The via barrier layer 31 may not be formed on an upper surface and a bottom of the via plug 35. Accordingly, the bottom of the via plug 35 and an upper surface of the base electrode 25 may be directly in contact with each other.

The interconnection structure 40 may include an interconnection barrier layer 41 conformally formed on sidewalls and a bottom of an interconnection trench 40T (shown in FIGS. 7A and 7B) exposing an upper surface of the via structure 30 in the middle interlayer insulating layer 13, a liner layer 43 conformally formed on the interconnection barrier layer 41, a seed layer 44 conformally formed on the liner layer 43, and an interconnection electrode 45 filling the interconnection trench 40T.

The interconnection barrier layer 41 and the via barrier layer 31 may be integrated to be materially continuous. Accordingly, the interconnection barrier layer 41 may include the same material as the via barrier layer 31. The interconnection barrier layer 41 may not be formed on the upper surface of the via plug 35.

The liner layer 43 may be conformally formed on the interconnection barrier layer 41 and the upper surface of the via plug 35. The liner layer 43 may include Co or Ru.

The seed layer 44 and the interconnection electrode 45 may include Cu. When the seed layer 44 and the interconnection electrode 45 include the same metal, a boundary between the seed layer 44 and the interconnection electrode 45 may disappear. Accordingly, as shown in FIGS. 2A and 2B, the boundary between the seed layer 44 and the interconnection electrode 45 is indicated by dotted lines.

The upper surface of the via plug 35 may be lower than the bottom of the interconnection trench 40T.

The interconnection structure 40 may further include an interconnection capping layer 46 on the upper surface of the interconnection electrode 45. The interconnection capping layer 46 may include Co or Ru. The interconnection capping layer 46 may be formed on upper surfaces of the seed layer 44, the liner layer 43, and the interconnection barrier layer 41. The interconnection capping layer 46 may protrude from the upper surface of the middle interlayer insulating layer 13.

The semiconductor device 100A may further include an upper stopper layer 14 and an upper interlayer insulating layer 15 on the via-interconnection structure 50. The upper stopper layer 14 may be in contact with the interconnection capping layer 46 and the middle interlayer insulating layer 13. The upper stopper layer 14 may include a compound containing silicon and nitrogen such as SiN or SiCN. The upper interlayer insulating layer 15 may include a compound containing silicon and oxygen such as $SiO_2$, SiCO, or SiCOH FIGS. 3A and 3B illustrate longitudinal cross-sectional views of a semiconductor device in accordance with some example embodiments of the inventive concepts.

Figure 3A:
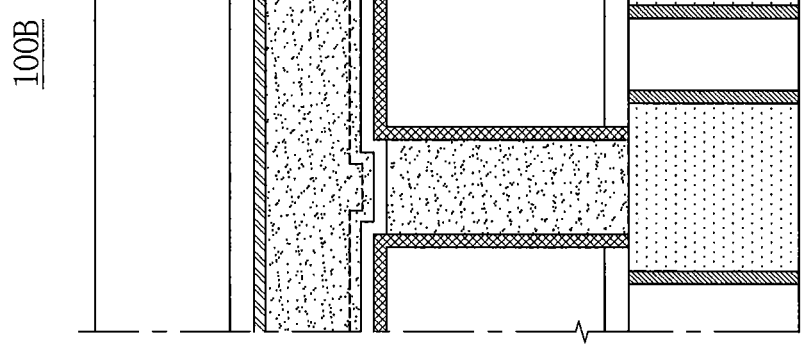
Figure 3B:
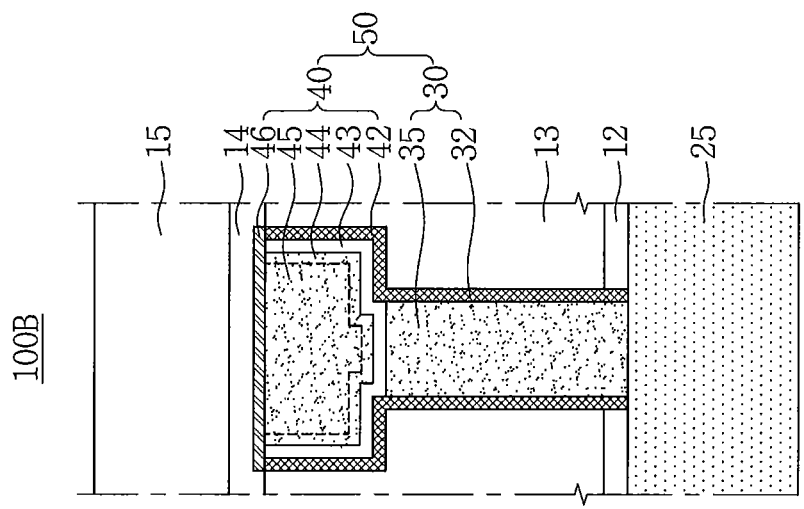

For example, FIG. 3A illustrates a longitudinal cross-sectional view taken along I-I' of the semiconductor device shown in FIG. 1 and FIG. 3B illustrates a longitudinal cross-sectional view taken along II-II' of the semiconductor device shown in FIG. 1.

Referring to FIGS. 3A and 3B, a semiconductor device 100B in accordance with some example embodiments of the inventive concepts may include a base structure 20, via-interconnection structure 50, a lower interlayer insulating layer 11, a lower stopper layer 12, a middle interlayer insulating layer 13, an upper stopper layer 14, and an upper interlayer insulating layer 15.

The base structure 20 may include a base barrier layer 21 and a base electrode 25.

The via-interconnection structure 50 may include a via structure 30 and an interconnection structure 40.

The via structure 30 may include a via barrier layer 32 conformally formed on inner walls of a via hole 30H, vertically passing through the middle interlayer insulating layer 13 and the lower stopper layer 12 to expose an upper surfaces of the base electrode 25, and a via plug 35 filling the via hole 30H.

The interconnection structure 40 may include a self-formed interconnection barrier layer 42 conformally formed on inner walls and a bottom of an interconnection trench 40T exposing an upper surface of the via structure 30 in the middle interlayer insulating layer 13, a liner layer 43 conformally formed on the self-formed interconnection barrier layer 42, and an interconnection electrode 45 filling the interconnection trench 40T.

The interconnection structure 40 may further include an interconnection capping layer 46 on an upper surface of the interconnection electrode 45.

Specifically, the via structure 30 may include the self-formed via barrier layer 32 conformally formed on the inner walls of the via hole 30H, and the interconnection structure 40 may include the self-formed interconnection barrier layer 42 conformally formed on the inner walls and the bottom of the interconnection trench 40T. The self-formed via barrier layer 32 and the self-formed interconnection barrier layer 42 may include a Mn-based metal. For example, the self-formed via barrier layer 32 may include a lower metal layer having Mn and an upper metal layer having Ta. The upper metal layer having Ta may include a single layered Ta or TaN, or a multi layered Ta/TaN or TaN/Ta, or Ta/TaN/Ta. In some example embodiments, the self-formed via barrier layer 32 may include a lower metal layer having Ta and an upper metal layer having Mn.

Other elements not described may be understood in reference to FIGS. 2A and 2B.

Figure 4A:
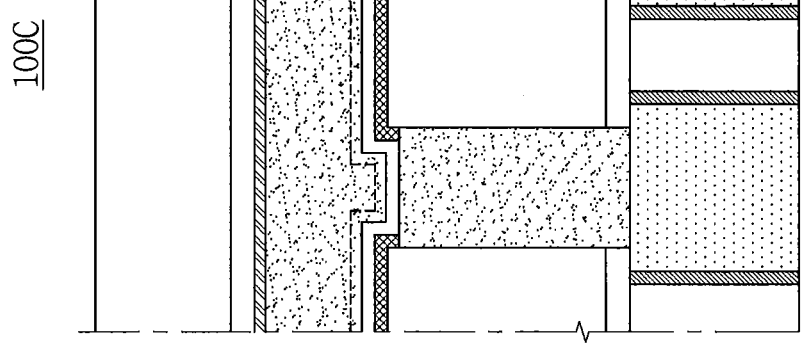
Figure 4B:
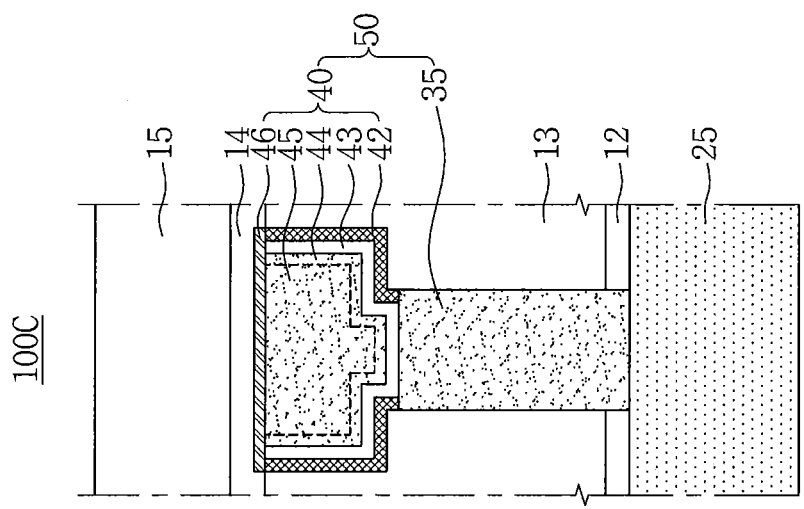

FIGS. 4A and 4B illustrate longitudinal cross-sectional views of a semiconductor device in accordance with some example embodiments of the inventive concepts.

For example, FIG. 4A illustrates a longitudinal cross-sectional view taken along I-I' of the semiconductor device shown in FIG. 1 and FIG. 4B illustrates a longitudinal cross-sectional view taken along II-II' of the semiconductor device shown in FIG. 1.

Referring to FIGS. 4A and 4B, a semiconductor device 100C in accordance with some example embodiments of the inventive concepts may include a base structure 20, a via-interconnection structure 50, a lower interlayer insulating layer 11, a lower stopper layer 12, a middle interlayer insulating layer 13, an upper stopper layer 14, and an upper interlayer insulating layer 15.

The base structure 20 may include a base barrier layer 21 and a base electrode 25.

The via-interconnection structure 50 may include a via plug 35 and an interconnection structure 40.

The via plug 35 may fill a via hole 30H vertically passing through the middle interlayer insulating layer 13 and the lower stopper layer 12 and exposing an upper surface of the base electrode. For example, the via barrier layer 31 and/or the self-formed via barrier layer 32 shown in FIGS. 2A to 3B may be omitted. Accordingly, the via plug 35 may be in contact with the lower stopper layer 12 and the middle interlayer insulating layer 13.

The interconnection structure 40 may include a self-formed interconnection barrier layer 42 conformally formed on inner walls and a bottom of an interconnection trench 40T exposing an upper surface of the via plug 35 in the middle interlayer insulating layer 13, a liner layer 43 conformally formed on the self-formed interconnection barrier layer 42, a seed layer 44 conformally formed on the liner layer 43, and an interconnection electrode 45 filling the interconnection trench 40T.

The upper surface of the via plug 35 may be lower than the bottom of the interconnection trench 40T. Accordingly, the self-formed interconnection barrier layer 42 may be formed on upper portions of inner walls of the via hole 30H. Lower end portions of the self-formed interconnection barrier layer 42 may be in contact with the upper surface of the via plug 35.

The interconnection structure 40 may further include an interconnection capping layer 46 on the upper surface of the interconnection electrode 45. Other elements not described may be understood in reference to FIGS. 3A and 3B.

Figure 5A:
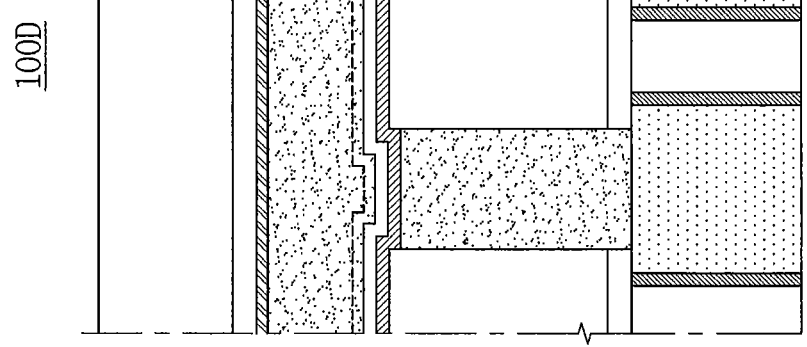
Figure 5B:
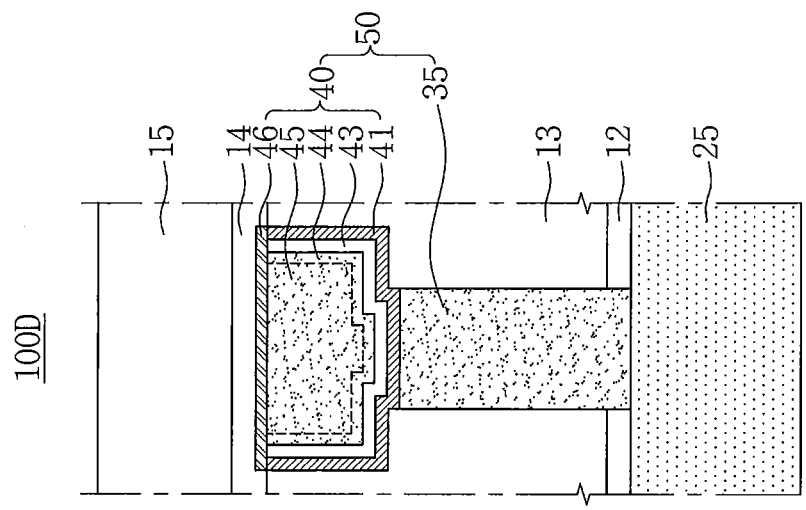

FIGS. 5A and 5B illustrate longitudinal cross-sectional views of a semiconductor device in accordance with some example embodiments of the inventive concepts.

For example, FIG. 5A illustrates a longitudinal cross-sectional view taken along I-I' of the semiconductor device shown in FIG. 1 and FIG. 5B illustrates a longitudinal cross-sectional view taken along II-II' of the semiconductor device shown in FIG. 1.

Referring to FIGS. 5A and 5B, a semiconductor device 100D in accordance with some example embodiments of the inventive concepts may include a base structure 20, a via-interconnection structure 50, a lower interlayer insulating layer 11, a lower stopper layer 12, a middle interlayer insulating layer 13, an upper stopper layer 14, and an upper interlayer insulating layer 15.

The base structure 20 may include a base barrier layer 21 and a base electrode 25.

The via-interconnection structure 50 a via structure 30 and an interconnection structure 40.

The via plug 35 may fill a via hole 30H vertically passing through the middle interlayer insulating layer 13 and the lower stopper layer 12 and exposing an upper surface of the base electrode 25. For example, the via barrier layer 31 and/or the self-formed via barrier layer 32 shown in FIGS. 2A to 3B may be omitted.

The interconnection structure 40 may include an interconnection barrier layer 41 conformally formed on inner walls and a bottom of an interconnection trench 40T and on an upper surface of the via plug 35 in the middle interlayer insulating layer 13, a liner layer 43 conformally formed on the interconnection barrier layer 41, a seed layer 44 conformally formed on the liner layer 43, and an interconnection electrode 45 filling the interconnection trench 40T.

The upper surface of via plug 35 may be lower than the bottom of the interconnection trench 40T. Accordingly, the interconnection barrier layer 41 may be formed on upper portions of the inner walls of the via hole 30H. The interconnection barrier layer 41 may be in contact with the upper surface of the via plug 35.

The interconnection structure 40 may further include an interconnection capping layer 46 on the upper surface of the interconnection electrode 45. Other elements not described may be understood in reference to FIGS. 2A and 2B.

FIGS. 6A and 6B to 13A to 13B illustrate longitudinal cross-sectional views of a semiconductor device to describe a method of fabricating the semiconductor device in accordance with some example embodiments of the inventive concepts.

For example, FIGS. 6A to 13A illustrate a longitudinal cross-sectional view taken along I-I' of the semiconductor device shown in FIG. 1 and FIGS. 2B to 13B illustrates a longitudinal cross-sectional view taken along II-II' of the semiconductor device shown in FIG. 1.

Figure 6B:
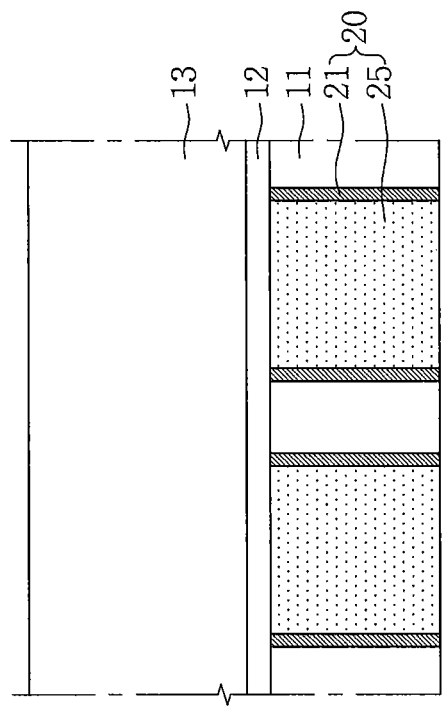
Figure 6A:
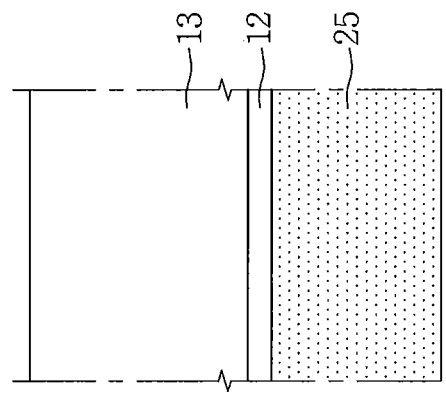

Referring to FIGS. 6A and 6B, a method of fabricating a semiconductor device in accordance with some example embodiments of the inventive concepts may include forming a lower interlayer insulating layer 11 and a base structure 20, forming a lower stopper layer 12 on the lower interlayer insulating layer 11 and the base structure 20, and forming a middle interlayer insulating layer 13 on the lower stopper layer 12.

The lower interlayer insulating layer 11 may include a compound containing silicon and oxygen such as $SiO_2$, SiCO, or SiCOH formed by performing a chemical vapor deposition (CVD) process.

The base structure 20 may include a base barrier layer 21 having TiN or TaN formed by performing a CVD process or a physical vapor deposition (PVD) process, and the base structure 20 may include W or Cu formed by performing a CVD process or a plating process.

The method may further include planarizing upper surfaces of the base structure 20 and the lower interlayer insulating layer 11 to be coplanar by performing a chemical mechanical polishing (CMP) process.

The lower stopper layer 12 may include a compound containing silicon and nitrogen such as SiN or SiCN formed by performing a CVD process.

The middle interlayer insulating layer 13 may include a compound containing silicon and oxygen such as $SiO_2$, SiCO, or SiCOH formed by performing a CVD process.

Figure 7B:
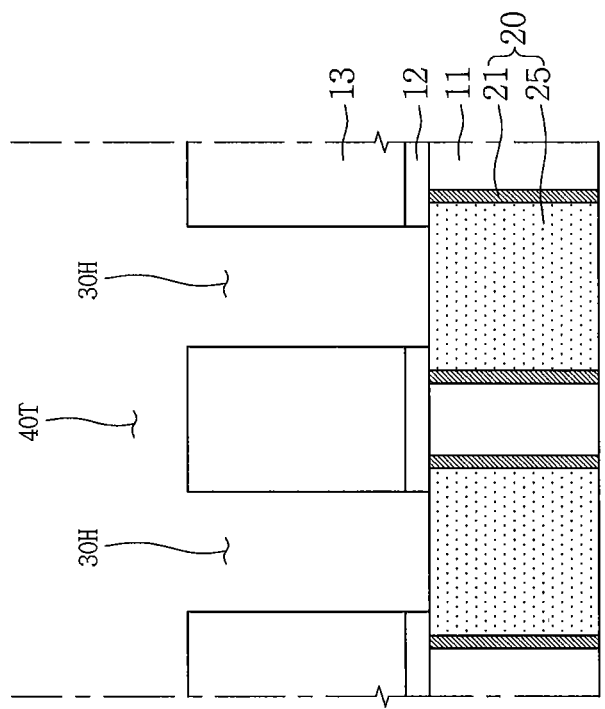
Figure 7A:
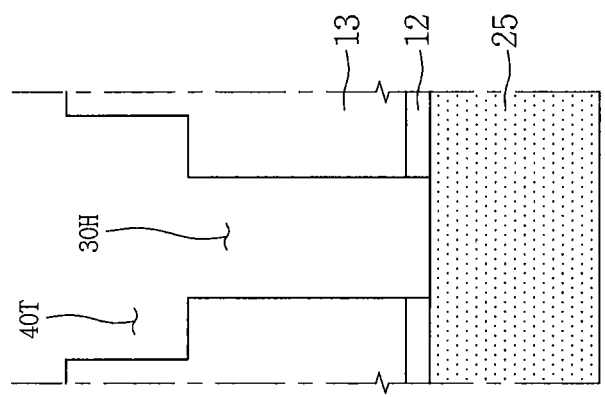

Referring to FIGS. 7A and 7B, the method may include performing a photolithography process and an etching process to form a via hole 30H vertically passing through the middle interlayer insulating layer 13 and the lower stopper layer 12 to expose an upper surface of the base structure 20, and an interconnection trench 40T vertically aligned with the via hole 30H in the middle interlayer insulating layer 13.

Figure 8B:
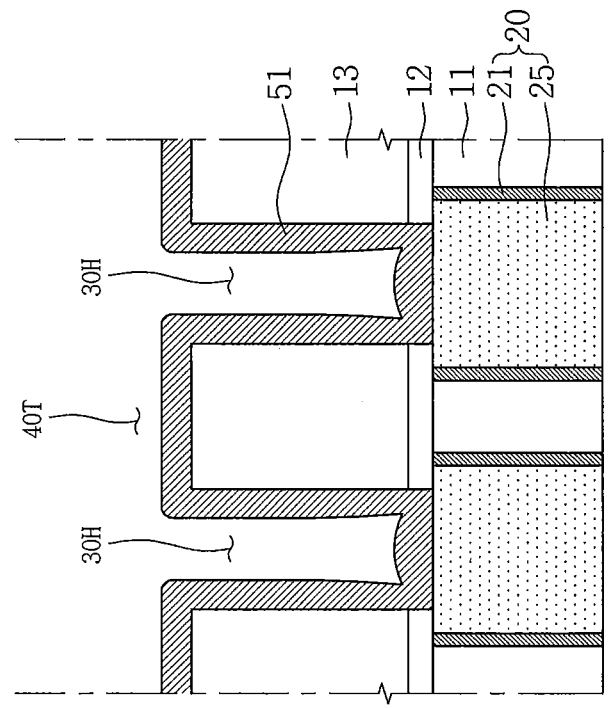
Figure 8A:
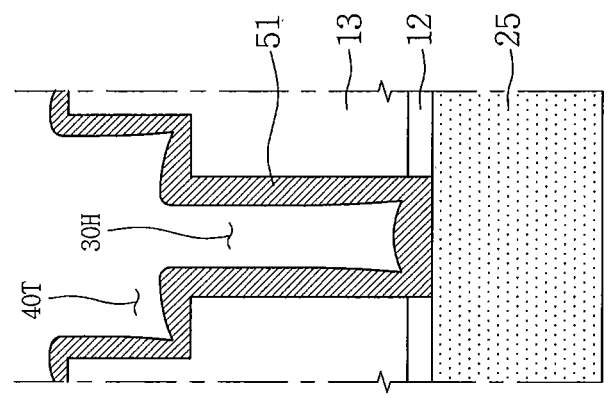

Referring to FIGS. 8A and 8B, the method include performing a PVD process to form a barrier material layer 51 on inner walls and a bottom of the interconnection trench 40T, inner walls of the via hole 30H, and the exposed upper surface of the base structure 20. The barrier material layer 51 may include at least one of Ta, TaN, Ti, and/or TiN.

Figure 9B:
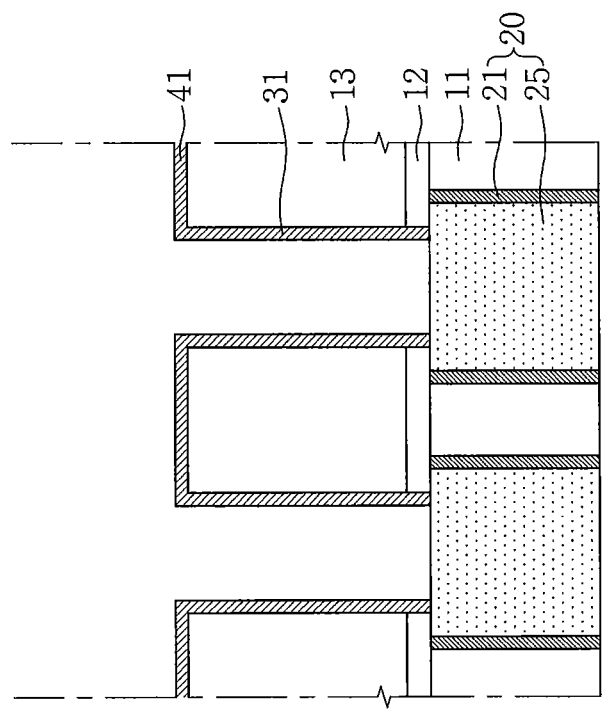
Figure 9A:
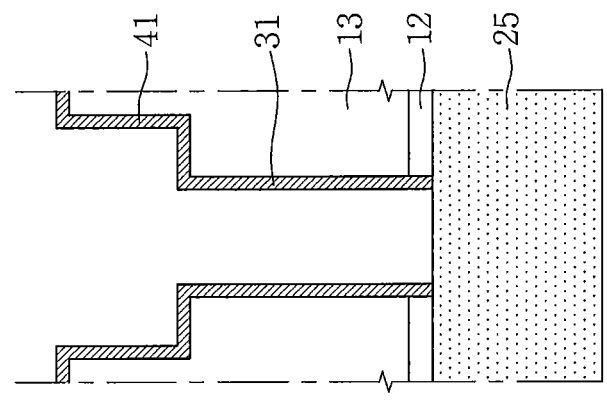

Referring to FIGS. 9A and 9B, the method may include performing a re-sputtering process to selectively remove the barrier material layer 51 on a bottom of the interconnection trench 40T, and remove almost (or, alternatively, substantially) all, or all, of the barrier material layer 51 on an exposed portion of the base structure 20. As a result of the re-sputtering process, a via barrier layer 31 may be conformally formed on the inner walls of the via hole 30H, and an interconnection barrier layer 41 may conformally formed on the inner walls and the bottoms of the interconnection trench 40T. The via barrier layer 31 may not be formed on the upper surface of the base structure 20. Accordingly, the upper surface of the base structure 20 may be exposed. The re-sputtering process may include performing an Ar plasma sputtering process.

Figure 10A:
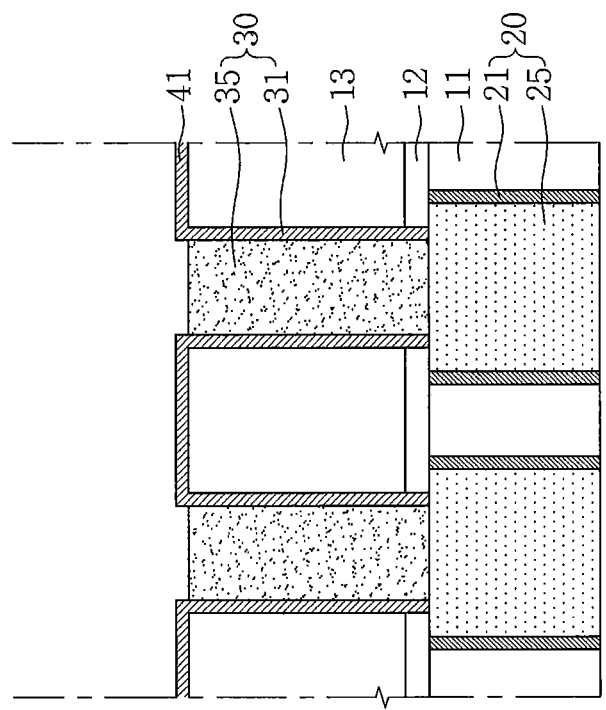
Figure 10B:
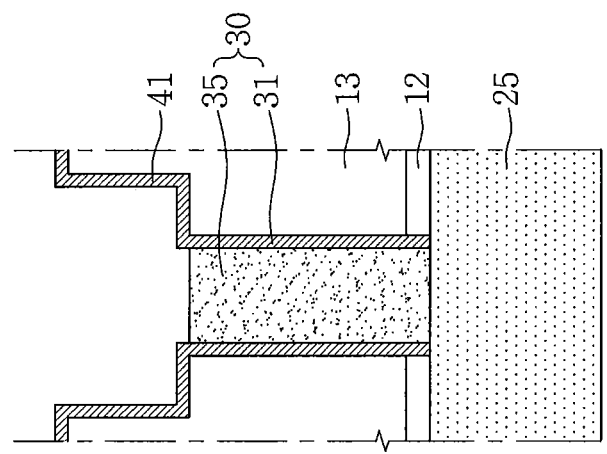

Referring FIGS. 10A and 10B, the process may include performing a selective CVD process to form a via plug 35 filling almost all of the via hole 30H. The via plug 35 may include Co or Ru. The upper surface of the via plug 35 may be lower than the bottom of the interconnection trench 40T. As a result of the CVD process, a via structure 30 including the via barrier layer 31 and the via plug 35 may be formed.

Figure 11A:
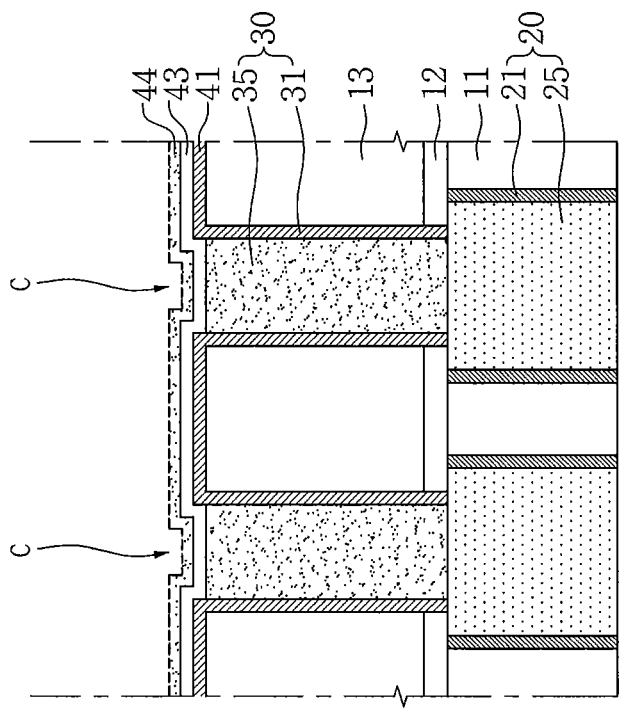
Figure 11B:
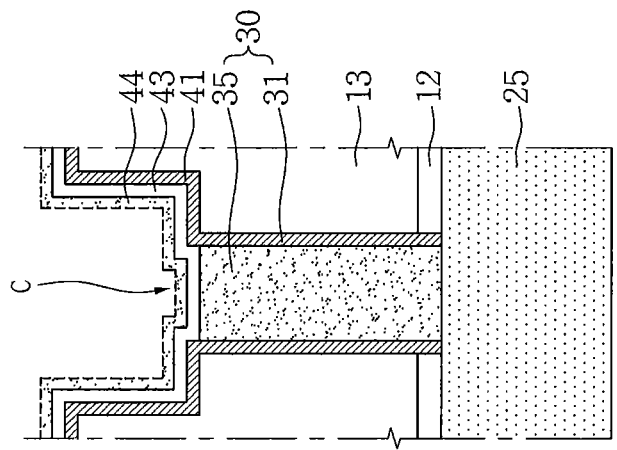

Referring to FIGS. 11A and 11B, the method may include performing a selective CVD process to form a liner layer 43 on the interconnection barrier layer 41 and the upper surface of the via plug 35, and performing a PVD process to form a seed layer 44 on the liner layer 43. The liner layer 43 may include Co or Ru, and the seed layer 44 may include Cu to perform a plating process. Because the upper surface of the via plug 35 is lower than the bottom of the interconnection trench 40T, the liner layer 43 and the seed layer 44 may have concave portions C on the via plug 35.

Figure 12A:
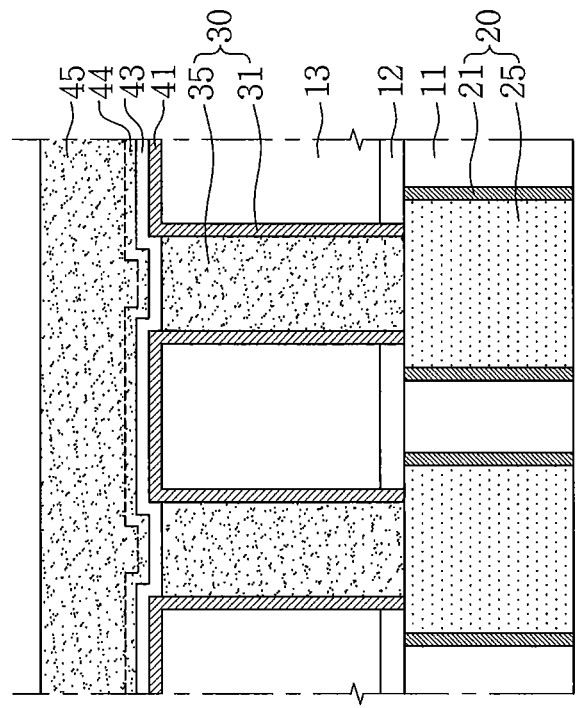
Figure 12B:
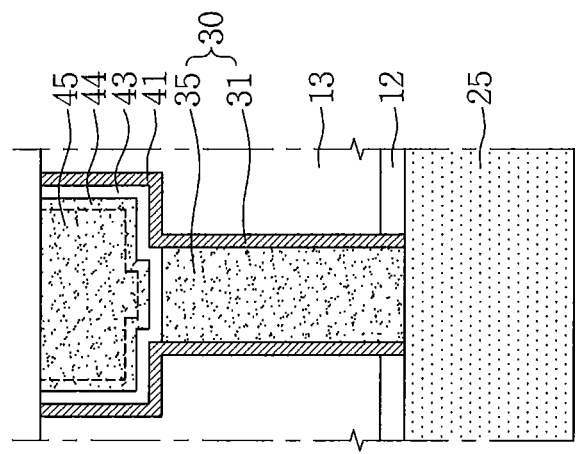

Referring the FIGS. 12A and 12B, the method includes performing a plating process to form an interconnection electrode 45 on the seed layer 44 to fill the interconnection trench 40T. The interconnection electrode 45 may include Cu. When the seed layer 44 and the interconnection electrode 45 include the same materials, a boundary between the seed layer 44 and the interconnection electrode 45 may be disappear. Accordingly, the boundary between the seed layer 44 and the interconnection electrode 45 is indicated using a dotted line.

The method may include performing a CMP process to planarize the upper surfaces of the interconnection barrier layer 41, the liner layer 43, the seed layer 44, and the interconnection electrode 45 to be coplanar.

Figure 13B:
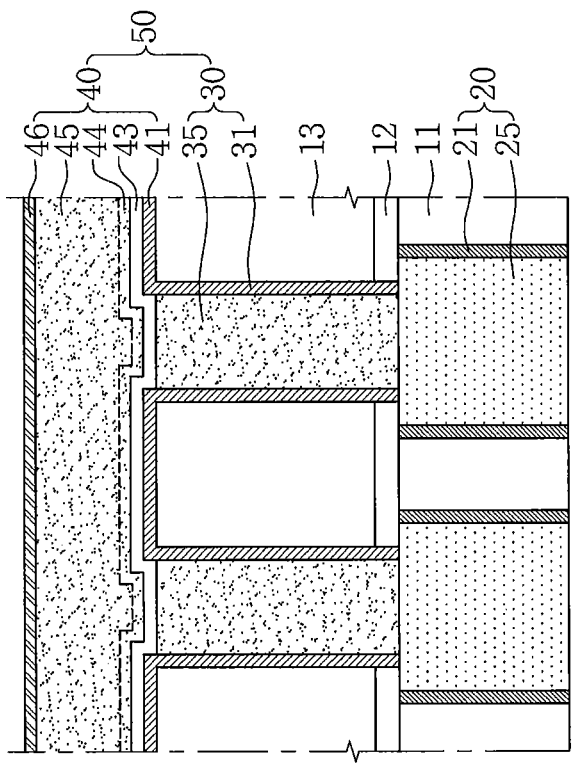
Figure 13A:
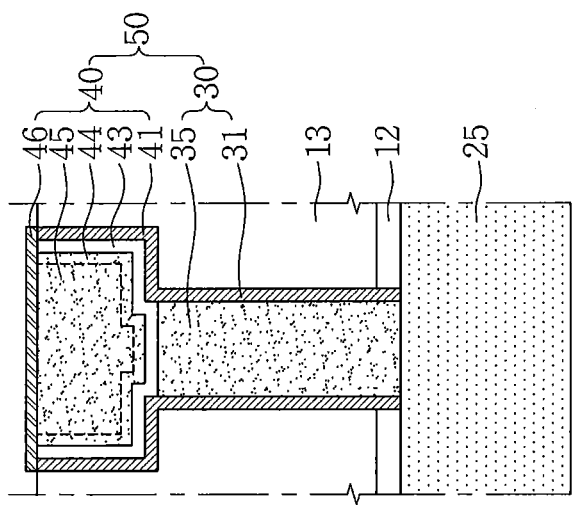

Referring to FIGS. 13A and 13B, the method may include performing a selective CVD process to form an interconnection capping layer 46 on the interconnection electrode 45. The interconnection capping layer 46 may include Co. The interconnection capping layer 46 may not be formed on the middle interlayer insulating layer 13. As a result of the selective CVD process, an interconnection structure 40 having the interconnection barrier layer 41, the liner layer 43, the seed layer 44, the interconnection electrode 45, and the interconnection capping layer 46 may be formed. Accordingly, a via-interconnection structure 50 having the via structure 30 and the interconnection structure 40 may be formed.

Next, referring to FIGS. 2A and 2B, the method may include forming an upper stopper layer 14 on the interconnection structure 40 and the middle interlayer insulating layer 13, and an upper interlayer insulating layer 15 on the upper stopper layer 14. The upper stopper layer 14 may include a compound containing silicon and nitrogen such as SiN or SiCN formed by performing a CVD process, and the upper interlayer insulating layer 15 may include a compound containing silicon and oxygen such as $SiO_2$, SiCO, or SiCOH formed by performing a CVD process.

FIGS. 14A and 14B to 15A to 15B illustrate longitudinal cross-sectional views of a semiconductor device to describe a method of fabricating the semiconductor device in accordance with some example embodiments of the inventive concepts.

Figure 14A:
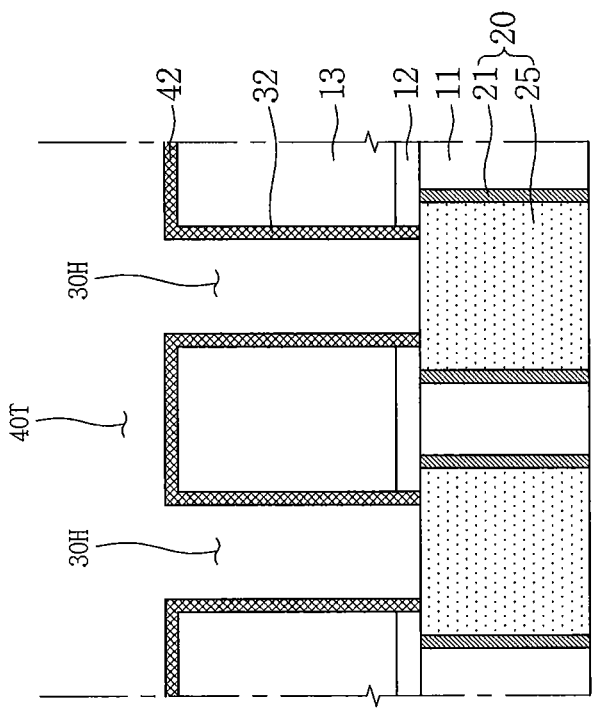
Figure 14B:
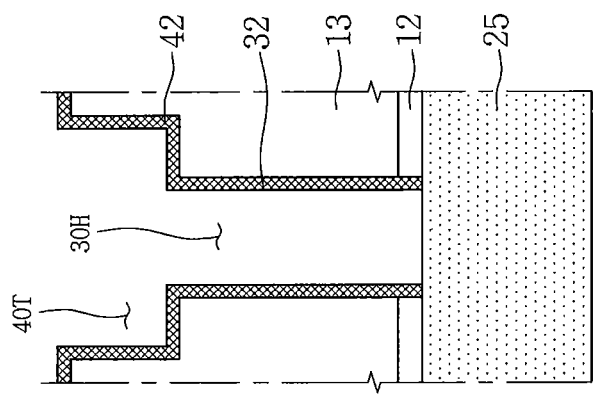
Figure 15B:
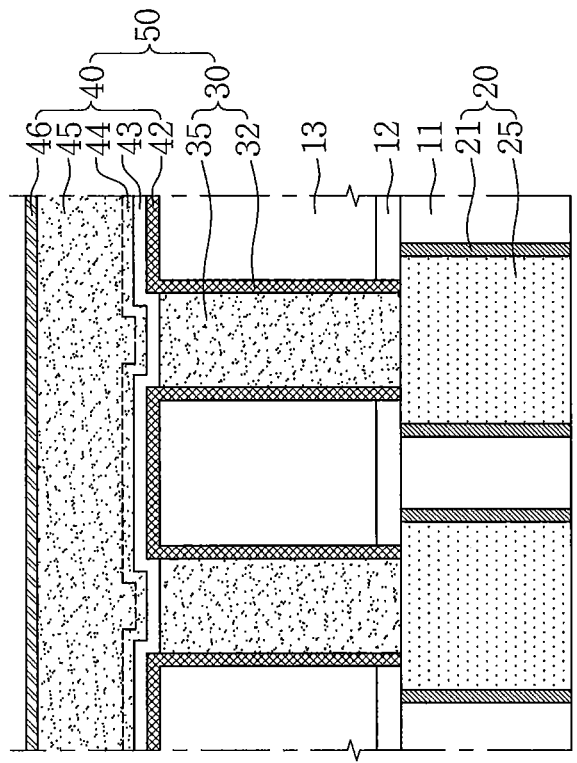
Figure 15A:
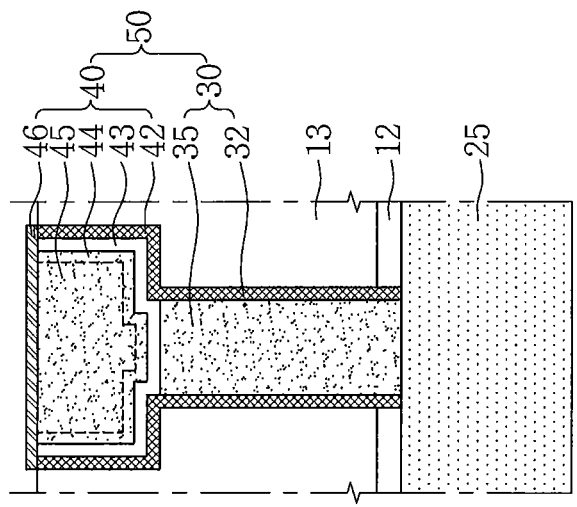

For example, FIGS. 14A and 15A illustrate longitudinal cross-sectional views taken along I-I' of the semiconductor device shown in FIG. 1 and FIGS. 14B and 15B illustrate longitudinal cross-sectional views taken along II-II' of the semiconductor device shown in FIG. 1.

Referring to FIGS. 14A and 14B, a method of fabricating a semiconductor device in accordance with some example embodiments of the inventive concepts may include, by performing the processes described in reference to FIGS. 6A and 6B to 8A and 8B, forming a lower interlayer insulating layer 11 and a base structure 20, forming a lower stopper layer 12 on the lower interlayer insulating layer 11 and the base structure 20, and forming a middle interlayer insulating layer 13 on the lower stopper layer 12, performing a photolithography process and an etching process to form a via hole 30H vertically passing through the middle interlayer insulating layer 13 and the lower stopper layer 12 to expose an upper surface of the base structure 20 and an interconnection trench 40T in the middle interlayer insulating layer 13 to be vertically aligned with the via hole 30H, and performing a self-forming process to form a self-formed interconnection barrier layer 42 on inner walls and a bottom of the interconnection trench 40T and a self-formed via barrier layer 32 on inner walls of the via hole 30H. The self-formed interconnection barrier layer 42 and the self-formed via barrier layer 32 formed by performing the self-forming process may not be formed on an upper surface of the base structure 20 and may only be formed on surfaces of the middle interlayer insulating layer 13. The upper surface of the base structure 20 may not be covered by the self-formed via barrier layer 32 and may be exposed.

The self-formed interconnection barrier layer 42 and the self-formed via barrier layer 32 may include Mn-based material. For example, the self-formed interconnection barrier layer 42 and the self-formed via barrier layer 32 may include a lower metal layer having Mn and an upper metal layer having Ta (and/or TaN, i.e., Ta/TaN/or Ta/TaN/Ta). In some example embodiments, the self-formed interconnection barrier layer 42 and the self-formed via barrier layer 32 may include a lower metal layer having Ta (and/or TaN, i.e., Ta/TaN/or Ta/TaN/Ta) and an upper metal layer having Mn.

Referring to FIGS. 15A and 15B, the method may include, by performing the processes described in reference to FIGS. 10A and 10B to 13A and 13B, forming a via plug 35 filling almost all of the via hole 30H, forming a liner layer 43 on an upper surface of the via plug 35, forming a seed layer 44 on the liner layer 43, forming an interconnection electrode 45 on the seed layer 44 to fill the interconnection trench 40T, performing a CMP process to planarize upper surfaces of the interconnection barrier layer 41, the liner layer 43, the seed layer 44, and the interconnection electrode 45 to be coplanar, and forming an interconnection capping layer 46 to form a via-interconnection structure 50 including a via structure 30 and an interconnection structure 40.

Next, further referring to FIGS. 3A and 3B, the method may include forming an upper stopper layer 14 on the interconnection structure 40 and the middle interlayer insulating layer 13, and an upper interlayer insulating layer 15 on the upper stopper layer 14.

FIGS. 16A and 16B to 18A to 18B illustrate longitudinal cross-sectional views of a semiconductor device to describe a method of fabricating the semiconductor device in accordance with some example embodiments of the inventive concepts.

For example, FIGS. 16A to 18A illustrate longitudinal cross-sectional views taken along I-I' of the semiconductor device shown in FIG. 1 and FIGS. 16B to 18B illustrate longitudinal cross-sectional views taken along II-II' of the semiconductor device shown in FIG. 1.

Figure 16B:
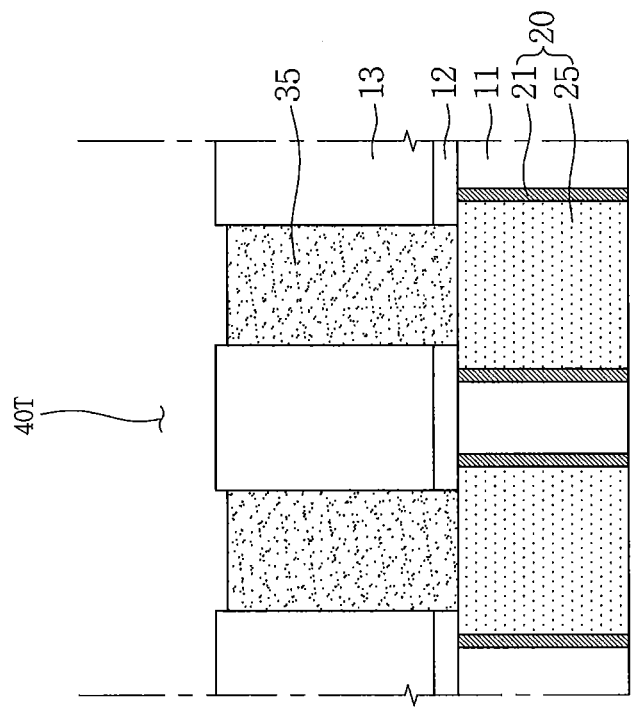
Figure 16A:
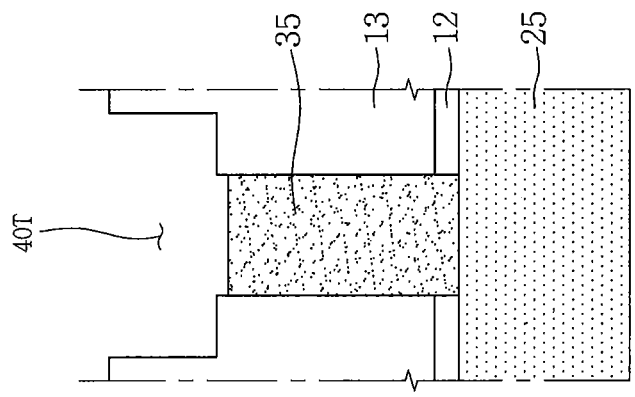

Referring to FIGS. 16A and 16B, a method of fabricating a semiconductor device in accordance with some example embodiments of the inventive concepts may include, by performing the processes described in reference to FIGS. 6A and 6B to 7A and 7B, forming a lower interlayer insulating layer 11 and a base structure 20, forming a lower stopper layer 12 on the lower interlayer insulating layer 11 and the base structure 20, forming a middle interlayer insulating layer 13 on the lower stopper layer 12, performing a photolithography process and an etching process to form a via hole 30H vertically passing through the middle interlayer insulating layer 13 and the lower stopper layer 12 to expose an upper surface of the base structure 20 and an interconnection trench 40T in the middle interlayer insulating layer 13 to be aligned with the via hole 30H, and forming a via plug 35 filling almost all of the via hole 30H.

Referring to FIGS. 17A and 17B, the method may include forming a self-formed interconnection barrier layer 42 on inner walls and a bottom of the interconnection trench 40T, and the exposed surface of the middle interlayer insulating layer 13. The self-formed interconnection barrier layer 42 may not be formed on an upper surface of the via plug 35. Accordingly, the upper surface of the via plug 35 may be exposed.

Figure 18B:
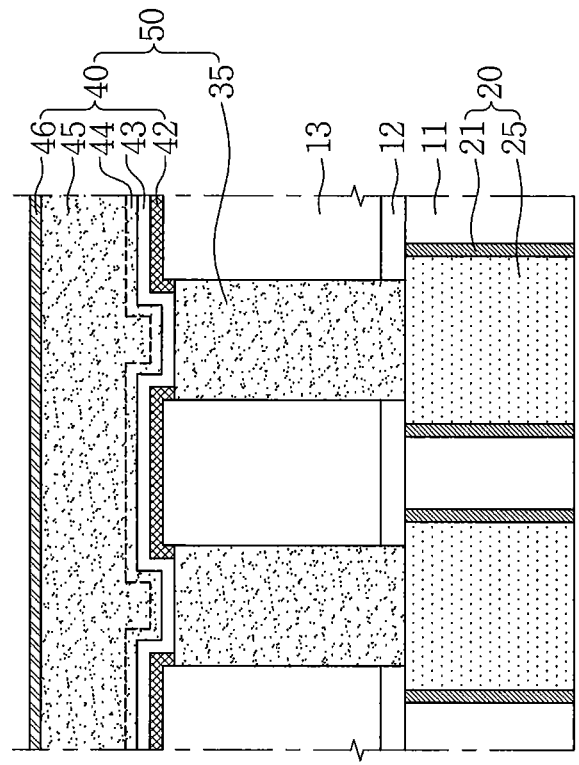
Figure 18A:
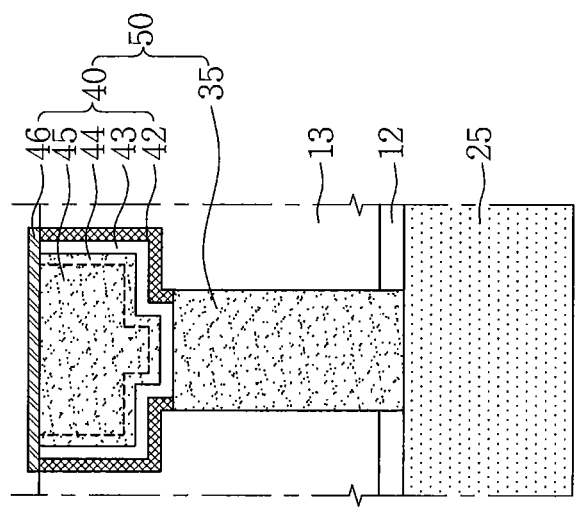

Referring to FIGS. 18A and 18B, the method may include, by performing the processes described in reference to FIGS. 11A and 11B to 13A and 13B, forming a liner layer 43 and a seed layer 44 on the self-formed interconnection barrier layer 42 and the exposed upper surface of the via plug 35, forming an interconnection electrode 45 on the seed layer 44 to fill the interconnection trench 40T, performing a CMP process to planarize upper surfaces of the self-formed interconnection barrier layer 42, the liner layer 43, the seed layer 44, and the interconnection electrode 45 to be coplanar, and forming an interconnection capping layer 46 to form an interconnection structure 40. As a result of the processes, a via-interconnection structure 50 having a via structure 30 and an interconnection structure 40 may be formed.

Next, the method may include, further referring to FIGS. 4A and 4B, forming an upper stopper layer 14 on the interconnection structure 40 and the middle interlayer insulating layer 13, and an upper interlayer insulating layer 15 on the upper stopper layer 14.

FIGS. 19A and 19B to 20A to 20B illustrate longitudinal cross-sectional views of a semiconductor device to describe a method of fabricating the semiconductor device in accordance with some example embodiments of the inventive concepts.

For example, FIGS. 19A to 20A illustrate longitudinal cross-sectional views taken along I-I' of the semiconductor device shown in FIG. 1 and FIGS. 19B to 20B illustrate longitudinal cross-sectional views taken along II-II' of the semiconductor device shown in FIG. 1.

Figure 19A:
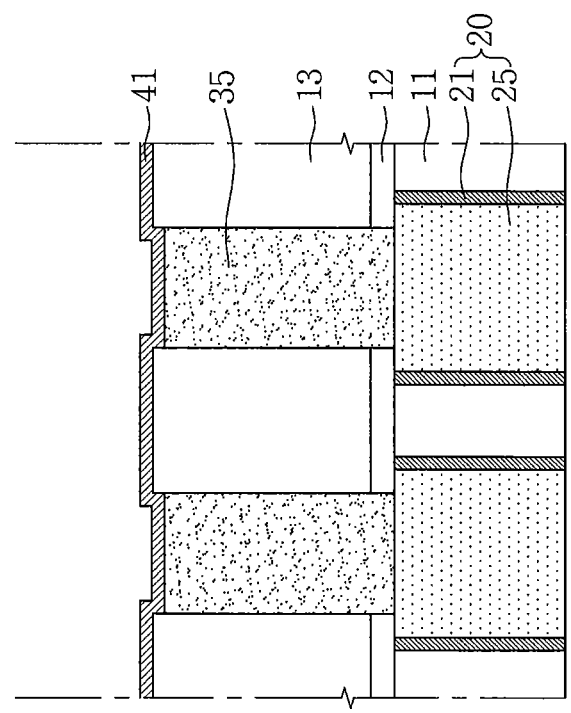
Figure 19B:
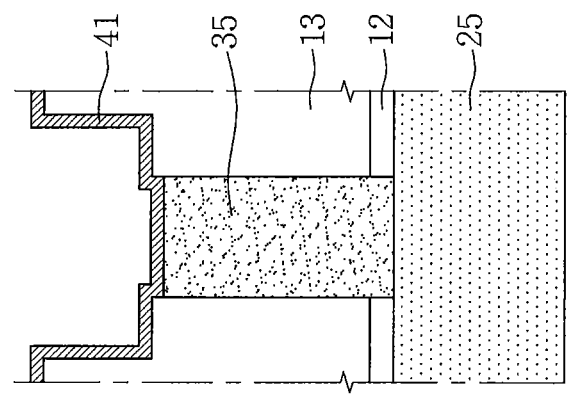

Referring to FIGS. 19A and 19B, a method of fabricating a semiconductor device in accordance with some example embodiments of the inventive concepts may include, by performing the processes described in reference to FIGS. 6A and 6B, 7A and 7B, and 16A and 16B, forming a lower interlayer insulating layer 11 and a base structure 20, forming a lower stopper layer 12 on the lower interlayer insulating layer 11 and the base structure 20, forming a middle interlayer insulating layer 13, performing a photolithography process and an etching process to form via hole 30H vertically passing through the middle interlayer insulating layer 13 and the lower stopper layer 12 to expose an upper surface of the base structure 20 and an interconnection trench 40T in the middle interlayer insulating layer 13 to vertically aligned with the via hole 30H, forming a via plug 35 filling almost all of the via hole 30H, and forming an interconnection barrier layer 41 on inner walls and a bottom of the interconnection trench 40T and an upper surface of the via plug 35. For example, the interconnection barrier layer 41 may include Ta and/or TaN.

Figure 20A:
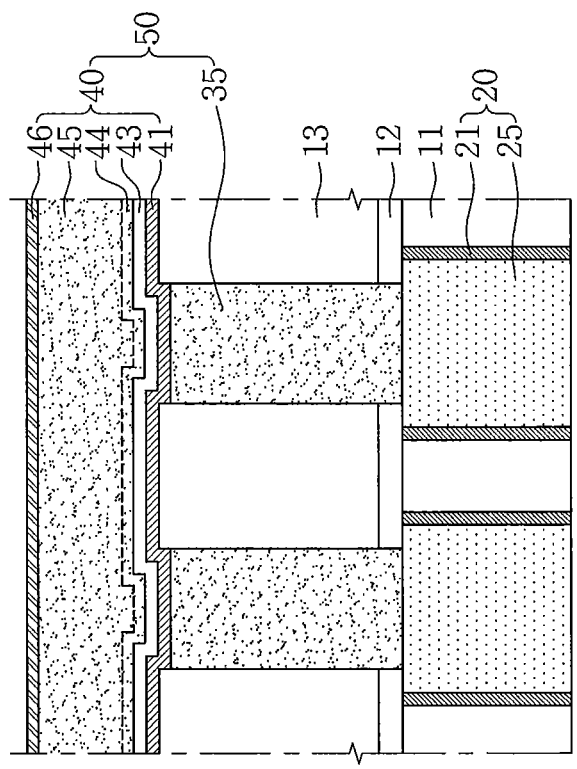
Figure 20B:
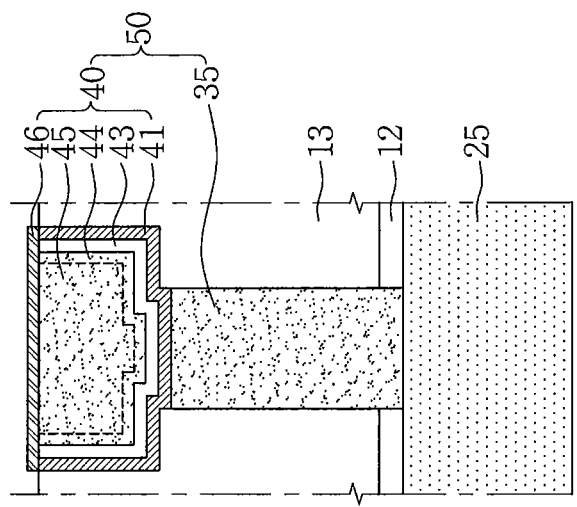

Referring to FIGS. 20A and 20B, the method may include, by performing the processes described in reference to FIGS. 11A and 11B to 13A and 13B, forming a liner layer 43 on the interconnection barrier layer 41, a seed layer 44 on the liner layer 43, forming an interconnection electrode 45 on the seed layer 44 to fill the interconnection trench 40T, performing a CMP process to planarize upper surfaces of the interconnection barrier layer 41, the liner layer 43, the seed layer 44, and the interconnection electrode 45 to be coplanar, and forming an interconnection capping layer 46 to form an interconnection structure 40. As a result of the processes, a via-interconnection structure 50 having the via structure 30 and the interconnection structure 40 may be formed.

Next, the method may include, further referring to FIGS. 5A and 5B, forming an upper stopper layer 14 on the interconnection structure 40 and the middle interlayer insulating layer 13, and forming an upper interlayer insulating layer 15 on the upper stopper layer 14.

Figure 21:
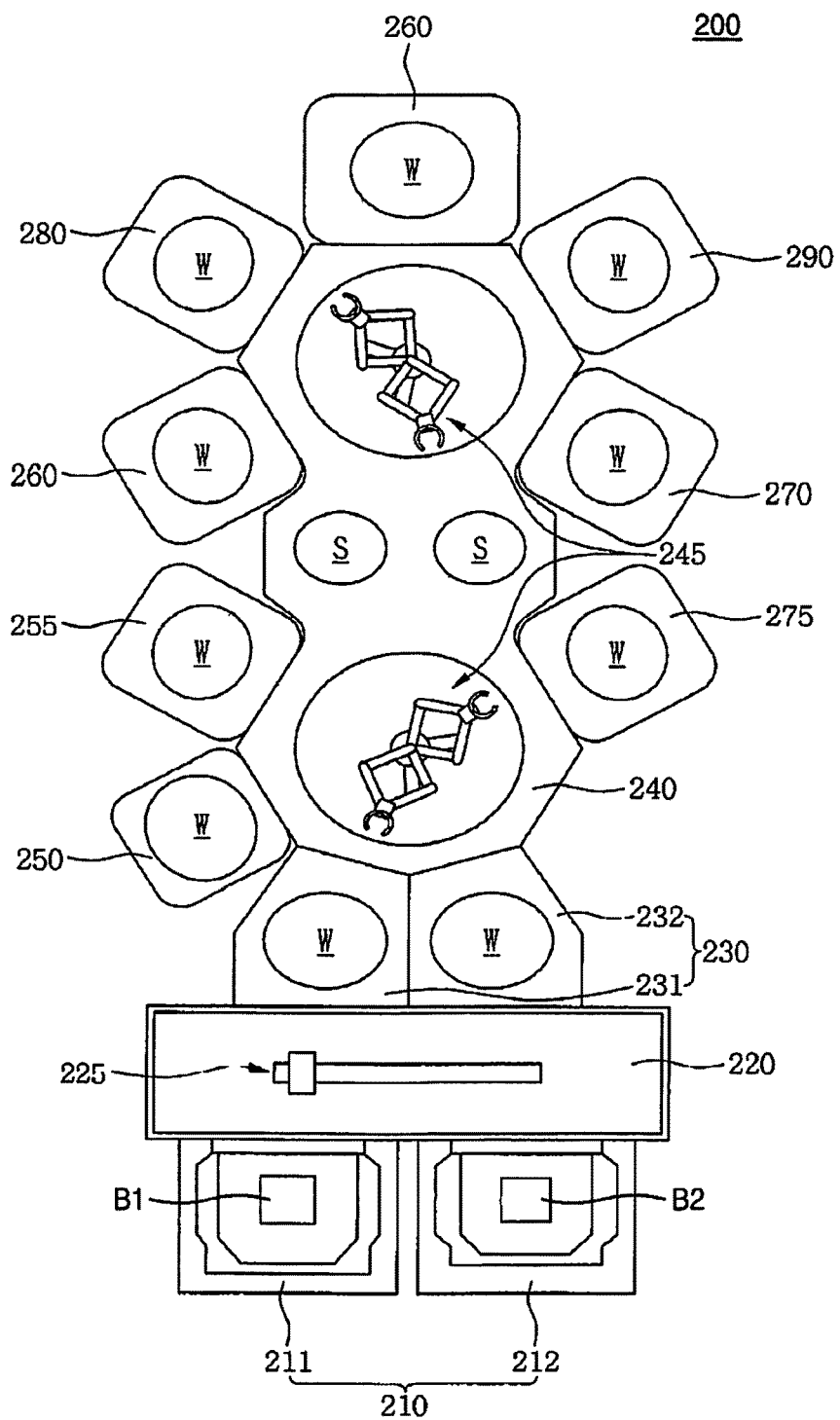

FIG. 21 is a diagram illustrating an apparatus for fabricating a semiconductor device in accordance with some example embodiments of the inventive concepts.

Referring to FIG. 21, an apparatus 200 for fabricating a semiconductor device in accordance with some example embodiments of the inventive concepts may include a wafer stocker 210, a transfer module 220, a load-lock chamber 230, a platform chamber 240, degassing chamber 250, a plasma chamber 255, a seed depositing chamber 260, barrier depositing chambers 270 and 275, a liner depositing chamber 280, and a CVD chamber 290. Each of the chambers 250, 255, 260, 270, 275, 280, and 290 may be a plurality. In some example embodiments, the apparatus 200 has two seed depositing chambers 260 and the barrier depositing chambers 270 and 275. The barrier depositing chambers 270 and 275 may include a first barrier depositing chamber 270 for depositing Ta, Ti, TaN, or TiN, and a second barrier depositing chamber 275 for depositing a Mn-based metal. In some example embodiments, the apparatus 200 may include only one of the first barrier depositing chamber 270 and the second barrier depositing chamber 275.

The wafer stocker 210 may include an inlet stocker 211 and an outlet stocker 212. A first wafer box B1 to be processed in the apparatus 200 may be mounted on the inlet stocker 211, and a second wafer box B2 to be processed in the apparatus 200 may be mounted on the outlet stocker 212. The first and second wafer boxes B1 and B2 may include a front open unified pod (FOUP) of a front open shipping box (FOSB).

A transfer robot 225 in the transfer module 220 may transfer wafers W between the wafer stocker 210 and the load-lock chamber 230.

The load-lock chamber 230 may include an inlet chamber 231 and an outlet chamber 232. The inlet chamber 231 may receive the wafers W in the first wafer box B1 on the inlet stocker 211 using the transfer robot 225 and vacuum an inside thereof, and transfer the wafers W to the platform chamber 240. The outlet chamber 232 may receive the wafers W from the platform chamber 240 and pressurize an inside thereof to atmospheric pressure and transfer the wafers W to the second wafer box B2 on the outlet stocker 212 using the transfer robot 225. In some example embodiments, the inlet chamber 231 and the outlet chamber 232 may be integrated.

The platform chamber 240 may transfer the wafers W between the chambers 230, 250, 255, 260, 270, 275, 280 and 290. The platform chamber 240 may include transfer arms 245, on which wafers W are temporarily mounted, to transfer the wafers W and wafer stages S.

A degassing process to heat the wafers W to a range of about 300° C. to about 400° C. may be performed in the degassing chamber 250.

A plasma process for processing the wafer W by using one of Ar plasma, $H_2$ plasma, or $NH_3$ plasma may be performed in the plasma chamber 255. For example, a surface of the wafer W or a surface of the barrier layer may be treated using the plasma in the plasma chamber 255.

A process to form a seed layer including at least one of Cu, Ti, or Ni may be performed in the seed depositing chamber 260. A reflow process to reflow the seed layer by heating the seed layer may be further performed in the seed depositing chamber 260.

A process to form a barrier layer including at least one of Ta, TaN, Ti, or TiN may be performed in the first barrier depositing chamber 270.

A process to form a self-formed barrier layer including Mn may be performed in the second barrier depositing chamber 275.

A process to form a liner layer including Co or Ru may be performed in the liner depositing chamber 280.

A process to form a Co layer or Ru layer by performing a selective CVD process may be performed in the CVD chamber 290. The apparatus 200 has a plurality of chambers 230, 250, 255, 260, 270, 275, 280, and 290 to perform sequential processes. Accordingly, the sequential processes may be performed continuously without any vacuum brakes. Thus, a processing time to fabricate the semiconductor device can be reduced and productivity can be improved.

A method of fabricating a semiconductor device using the apparatus 200 in accordance with some example embodiments of the inventive concepts may include, further referring to FIGS. 7A and 7B, mounting the first wafer box B1 having the wafers W on the wafer inlet stocker 211. A base structure 20, and a middle interlayer insulating layer 13 having an interconnection trench 40T and a via hole 30H formed therein may be formed on the wafers W.

The method may include transferring the wafers W in the first wafer box B1 to inside of the inlet chamber 231 of the load-lock chamber 230.

The method may include sealing and vacuuming the inlet chamber 231.

The method may include transferring the wafers W in the inlet chamber 231 into the degassing chamber 250 using the transfer arm 245 in the platform chamber 240.

The method may include heating the wafers W in the degassing chamber 250 to degas the wafers W to remove the impurity gases.

The method may include, further referring to FIGS. 8A and 8B, forming a barrier material layer 51 having at least one of Ta, TaN, Ti, or TiN on inner walls and a bottom of the interconnection trench 40T and inner walls and a bottom of the via hole 30H in the barrier depositing chamber 270.

The method may include, further referring to FIGS. 9A and 9B, removing portions of the barrier material layer 51 formed on the base structure 20 in the via hole 30H in the plasma chamber 255 to form the via barrier layer 31 and the interconnection barrier layer 41.

The method may include, further referring to FIGS. 10A and 10B, forming a via plug 35 in the CVD chamber 290.

The method may include, further referring to FIGS. 11A and 11B, forming a liner layer 43 on the interconnection barrier layer 41 and the via plug 35 in the liner depositing chamber 280.

The method may include, further referring to FIGS. 11A and 11B, forming a seed layer 44 on the liner layer 43 in the seed depositing chamber 260.

The method may include transferring the wafers W into the outlet chamber 232 of the load-lock chamber 230 using the transfer arm 245 in the platform chamber 240.

The method may include sealing the outlet chamber 232 and pressurizing the inside of the outlet chamber 232 to atmospheric pressure.

The method may include transferring the wafers W in the outlet chamber 232 to the second wafer box B2 on the outlet stocker 212 of the wafer stocker 210 using the transfer robot 225 in the transfer module 220.

A method of fabricating a semiconductor device using the apparatus 200 in accordance with some example embodiments of the inventive concepts may include, further referring to FIGS. 7A and 7B, mounting the first wafer box B1 having a wafer W loaded therein on the inlet stocker 211 of the wafer stocker 210. A base structure 20, and a middle interlayer insulating layer 13 having an interconnection trench 40T and a via hole 30H formed therein may be formed on the wafers W.

The method may include transferring the wafer W on the inlet stocker 211 into the inlet chamber 231 of the load-lock chamber 230 through the transfer module 220.

The method may include sealing and vacuuming the inlet chamber 231.

The method may include transferring the wafer W in the evacuated inlet chamber 231 into the degassing chamber 250 using the transfer arm 245 in the platform chamber 240.

The method may include heating the wafer W in the degassing chamber 250 to degas the wafers W to remove the impurity gases.

The method may include, further referring to FIGS. 16A and 16B, forming a via plug 35 in the via hole 30H in the CVD chamber 290.

The method may include, further referring to FIGS. 19A and 19B, forming an interconnection barrier layer 41 on inner walls and a bottom of an interconnection trench 40T and an upper surface of the via plug 35 in the barrier depositing chamber 270.

The method may include, further referring to FIGS. 11A and 11B, forming a liner layer 43 on the interconnection barrier layer 41 and the via plug 35 in the liner depositing chamber 280, and forming a seed layer 44 on the liner layer 43 in the seed depositing chamber 260.

The method may include transferring the wafer W into the outlet chamber 232 of the load-lock chamber 230 using the transfer arm 245 in the platform chamber 240.

The method may include sealing the outlet chamber 232 and pressurizing the inside of the outlet chamber 232 to atmospheric pressure.

The method may include transferring the wafer W into the second wafer box B2 on the outlet stocker 212 of the wafer stocker 210 using the transfer robot 225 in the transfer module 220.

A method of fabricating a semiconductor device using the apparatus 200 in accordance with some example embodiments of the inventive concepts may include, referring to FIGS. 7A and 7B, mounting the first wafer box B1 having the wafer W loaded therein on the inlet stocker 211 of the wafer stocker 210. A base structure 20 and a middle interlayer insulating layer 13 having an interconnection trench 40T and a via hole 30H formed therein may be formed on the wafer W.

The method may include transferring the wafer W in the first wafer box B1 into the inlet chamber 231 of the load-lock chamber 230 using the transfer robot 225 in the transfer module 220.

The method may include sealing the inlet chamber 231 and evacuating inside of the inlet chamber 231.

The method may include transferring the wafer W in the inlet chamber 231 into the degassing chamber 250 using the transfer arm 245 in the platform chamber 240.

The method may include heating the wafer W in the degassing chamber 250 to degas the wafer W to remove the impurity gases.

The method may include, further referring FIGS. 14A and 14B, forming a self-formed interconnection barrier layer 42 on inner walls and a bottom of the interconnection trench 40T, and forming a self-formed via barrier layer 32 on inner walls of the via hole 30H in the self-forming barrier depositing chamber 275.

The method may include, further referring FIGS. 10A and 10B, forming a via plug 35 on the self-formed via barrier layer 32 in the CVD chamber 290.

The method may include, further referring to FIGS. 11A and 11B, forming a liner layer 43 on the inner walls and a bottom of the interconnection trench 40T and the via plug 35 in the liner depositing chamber 280, and forming a seed layer 44 on the liner layer 43 in the seed depositing chamber 260.

The method may include transferring the wafer W into the outlet chamber 232 of the load-lock chamber 230 using the transfer arm 245 in the platform chamber 240.

The method may include sealing the outlet chamber 232 and pressurizing the inside of the outlet chamber 232 to atmospheric pressure.

The method may include transferring the wafer W in the outlet chamber 232 into the second wafer box B2 on the outlet stocker 212 of the wafer stocker 210 using the transfer robot 225 in the transfer module 220.

A method of fabricating a semiconductor device using the apparatus 200 in accordance with some example embodiments of the inventive concepts may include, further referring FIGS. 7A and 7B, mounting the first wafer box B1 having a wafer W loaded therein on the inlet stocker 211 of the wafer stocker 210. A base structure 20 and a middle interlayer insulating layer 13 having an interconnection trench 40T and a via hole 30H formed therein may be formed on the wafer W.

The method may include transferring the wafer W on the inlet stocker 211 into the inlet chamber 231 of the load-lock chamber 230 using the transfer module 220.

The method may include sealing and vacuuming the inlet chamber 231.

The method may include transferring the wafer W in the inlet chamber 231 into the degassing chamber 250 using the transfer arm 245 in the platform chamber 240.

The method may include heating the wafer in the degassing chamber 250 to degas the wafers to remove the impurity gases.

The method may include, further referring to FIGS. 16A and 16B, forming a via plug 35 in the via hole 30H in the CVD chamber 290.

The method may include, further referring to FIGS. 17A and 17B, forming a self-formed interconnection barrier layer 42 on inner walls and a bottom of the interconnection trench 40T in the self-forming barrier depositing chamber 275.

The method may include, further referring to FIGS. 18A and 18B, forming a liner layer 43 on the self-formed interconnection barrier layer 42 and the via plug 35 in the liner depositing chamber 280, and forming a seed layer 44 on the liner layer 43 in the seed depositing chamber 260.

The method may include transferring the wafer W into the outlet chamber 232 of the load-lock chamber 230 using the transfer arm 245 in the platform chamber 240.

The method may include sealing the outlet chamber 232 and pressurizing the inside of the outlet chamber 232 to atmospheric pressure.

The method may include transferring the wafer W in the outlet chamber 232 into the second wafer box B2 on the outlet stocker 212 of the wafer stocker 210 using the transfer robot 225 in the transfer module 220.

Figure 22A:
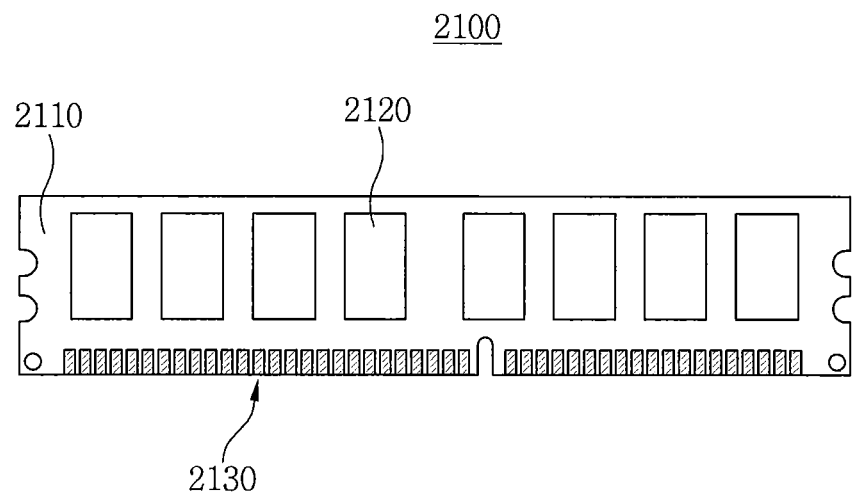
FIG. 22A is a conceptual diagram showing a memory module including at least one of the semiconductor devices in accordance with some example embodiments of the inventive concepts.

FIG. 22A is a diagram conceptually showing a memory module including at least one of the semiconductor devices in accordance with some example embodiments of the inventive concepts.

Referring to FIG. 22A, a memory module 2100 in accordance with some example embodiments of the inventive concepts may include a module substrate 2110, a plurality of memory devices 2120 disposed on the module substrate 2110, and a plurality of terminals 2130 arranged on a side of the module substrate 2110. The module substrate 2110 may include a printed circuit board (PCB). The memory devices 2120 may include at least one of the semiconductor devices 100A-100D in accordance with some example embodiments of the inventive concepts. The plurality of terminals 2130 may include a metal such as copper. Each of the terminals 2130 may be electrically connected with each of the memory devices 2120.

Figure 22B:
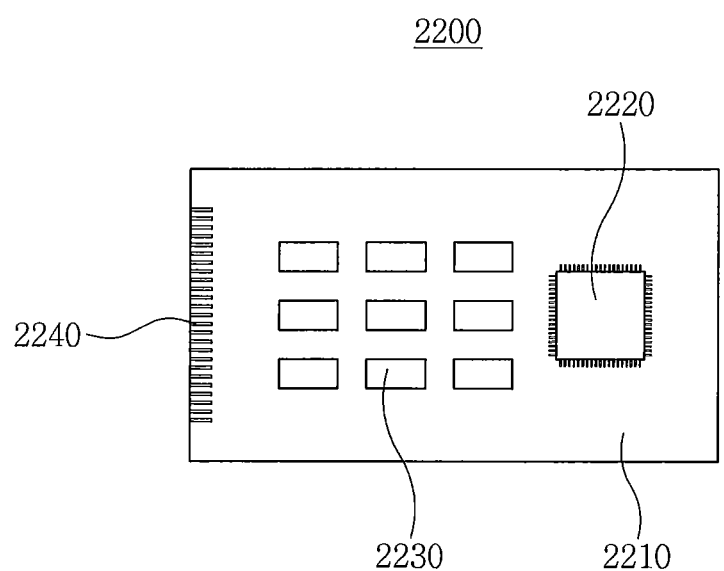
FIG. 22B is a conceptual diagram showing a semiconductor module including at least one of the semiconductor devices in accordance with some example embodiments of the inventive concepts.

FIG. 22B is a diagram conceptually showing a semiconductor module in accordance with some example embodiments of the inventive concepts.

Referring to FIG. 22B, a semiconductor module 2200 in accordance with some example embodiments of the inventive concepts may include a processor 2220 mounted on a module substrate 2210, and semiconductor devices 2230. The processor 2220 or the semiconductor devices 2230 may include at least one of the semiconductor devices 100A-100D in accordance with some example embodiments of the inventive concepts. Conductive input/output terminals 2240 may be disposed on at least one side of the module substrate 2210.

Figure 22C:
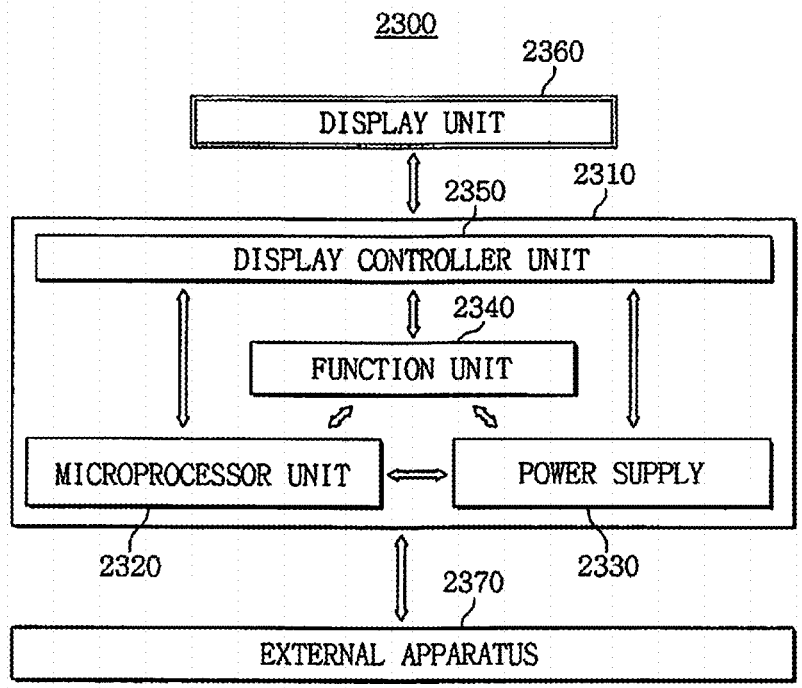
Figure 22D:
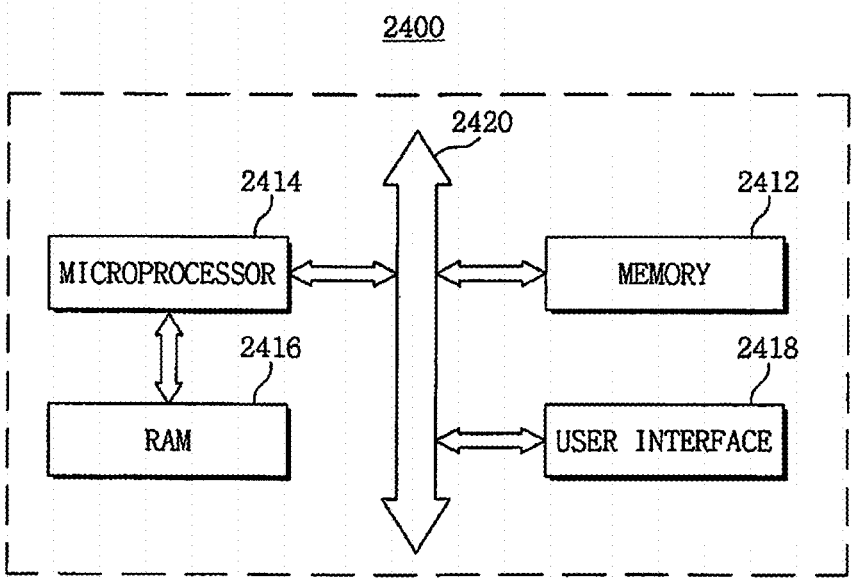

FIGS. 22C and 22D are block diagrams conceptually showing electronic systems in accordance with some example embodiments of the inventive concepts.

Referring to FIG. 22C, an electronic system 2300 in accordance with some example embodiments of the inventive concepts may include a body 2310, a display unit 2360, and an external apparatus 2370. The body 2310 may include a microprocessor unit 2320, a power supply 2330, a function unit 2340, and/or a display controller unit 2350. The body 2310 may include a system board or motherboard including a PCB and/or a case. The microprocessor unit 2320, the power supply 2330, the function unit 2340, and the display controller unit 2350 may be mounted or disposed on an upper surface or an inside of the body 2310. The display unit 2360 may be disposed on the upper surface of the body 2310 or inside/outside of the body 2310. The display unit 2360 may display an image processed by the display controller unit 2350. For example, the display unit 2360 may include a liquid crystal display (LCD), an active matrix organic light emitting diode (AMOLED), or various display panels. The display unit 2360 may include a touch screen. Accordingly, the display unit 2360 may include an input/output function. The power supply 2330 may supply a current or voltage to the microprocessor unit 2320, the function unit 2340, the display controller unit 2350, etc. The power supply 2330 may include a rechargeable battery, a socket for the battery, or a voltage/current converter. The microprocessor unit 2320 may receive a voltage from the power supply 2330 to control the function unit 2340 and the display unit 2360. For example, the microprocessor unit 2320 may include a CPU or an application processor (AP). The function unit 2340 may include a touch-pad, a touch-screen, a volatile/nonvolatile memory, a memory card controller, a camera, a lighting, an audio and video playback processor, a wireless transmission/reception antenna, a speaker, a microphone, a USB port, and other units having various functions. The microprocessor unit 2320 or the function unit 2340 may include at least one of the semiconductor devices 100A-100D in accordance with some example embodiments of the inventive concepts.

Referring to FIG. 22D, an electronic system 2400 in accordance with some example embodiments of the inventive concepts may include a microprocessor 2414, a memory 2412, and a user interface 2418 which performs data communication using a bus 2420. The microprocessor 2414 may include a CPU or an AP. The electronic system 2400 may further include a random access memory (RAM) 2416 which directly communicates with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a lighting, or various other input/output devices. The memory 2412 may store codes for operating the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include at least one of the semiconductor devices 100A-100D in accordance with some example embodiments of the inventive concepts.

A semiconductor device in accordance with some example embodiments of the inventive concepts includes an excellently formed via structure and an interconnection structure without any voids and seams.

A semiconductor device in accordance with some example embodiments of the inventive concepts includes a via plug without a via barrier layer so that a resistance of the via plug can be lowered.

A semiconductor device in accordance with some example embodiments of the inventive concepts includes a conductive interconnection capping layer so that a resistance of the interconnection can be lowered.

According to a method of fabricating a semiconductor device in accordance with some example embodiments of the inventive concepts, a via plug having a high aspect ratio and an interconnection electrode can be excellently formed.

An apparatus in accordance with some example embodiments of the inventive concepts includes a plurality of chambers to perform sequential processes so that the sequential processes can be continuously performed without any vacuum brakes. Accordingly, a processing time to can be reduced and productivity can be higher.

Although some example embodiments have been described, those skilled in the art will readily appreciate that many modifications are possible without materially departing from the novel teachings and advantages. Accordingly, all such modifications are intended to be included within the scope of the inventive concepts as defined in the claims.

What is claimed is:

1. A method of fabricating a semiconductor device, the method comprising:
    forming a lower interlayer insulating layer and a conductive base structure, upper surfaces of the lower interlayer insulating layer and the conductive base structure being coplanar;
    forming a middle interlayer insulating layer covering the lower interlayer insulating layer and the conductive base structure;
    forming,
        (i) a via hole vertically extending through the middle interlayer insulating layer to expose the upper surface of the conductive base structure, and
        (ii) an interconnection trench vertically aligned with the via hole;
    forming,
        a via barrier layer on inner walls of the via hole, and
        an interconnection barrier layer on inner walls and a bottom of the interconnection trench, the via barrier layer not being formed on the upper surface of the conductive base structure;
    forming a via plug on the via barrier layer to fill the via hole;
    forming a seed layer on the interconnection barrier layer and an upper surface of the via plug;
    forming an interconnection electrode on the seed layer; and
    forming an interconnection capping layer on the interconnection electrode.

2. The method of claim 1, wherein the conductive base structure comprises:
    a base electrode, and
    a base barrier layer surrounding the base electrode.

3. The method of claim 2, wherein an upper surface of the base electrode is not covered by the base barrier layer.

4. The method of claim 1, wherein the via barrier layer and the interconnection barrier layer comprise at least one selected from TaN, TiN, and Mn.

5. The method of claim 1, wherein the forming the via barrier layer comprises:
    conformally forming a barrier material layer on the inner walls of the via hole and the upper surface of the exposed conductive base structure; and
    removing the barrier material layer formed on the upper surface of the conductive base structure.

6. The method of claim 5, wherein the removing the barrier material layer on the upper surface of the conductive base structure comprises performing an Ar plasma sputtering process.

7. The method of claim 1, wherein the upper surface of the via plug is lower than the bottom of the interconnection trench.

8. The method of claim 1, wherein the via, plug comprises at least one selected from Co and Ru.

9. The method of claim 1, wherein
    the interconnection capping layer is not formed on an upper surface of the middle interlayer insulating layer,
    the interconnection capping layer protrudes from an upper surface of the interconnection electrode, and
    the interconnection capping layer has an upper surface higher than the upper surface of the middle interlayer insulating layer.

10. The method of claim 1, wherein the interconnection capping layer comprises at least one selected from Ru and Co.

11. The method of claim 1, further comprising:
    forming a lower stopper layer between the lower interlayer insulating layer and the middle interlayer insulating layer.

12. The method of claim 11, further comprising:
    forming an upper stopper layer on the interconnection capping layer; and
    forming an upper interlayer insulating layer on the upper stopper layer.

13. The method of claim 1, further comprising:
    conformally forming a liner layer between the interconnection barrier layer and the seed layer.

14. The method of claim 13, wherein the liner layer comprises at least one selected from Co and Ru.

15. A method of fabricating a semiconductor device, the method comprising:
    forming a lower interlayer insulating layer and a base structure, upper surfaces of the lower interlayer insulating layer and the base structure being coplanar;
    forming a lower stopper layer covering the lower interlayer insulating layer and the base structure;
    forming a middle interlayer insulating layer on the lower stopper layer;
    forming,
        (i) a via hole vertically extending through the middle interlayer insulating layer and the lower stopper layer, and
        (ii) an interconnection trench vertically aligned with the via hole;
    forming a via plug filling the via hole without forming a barrier layer on sidewalls or a bottom of the via hole;
    forming an interconnection barrier layer on an upper surface of the via plug and inner walls and a bottom of the interconnection trench;
    forming a liner layer on the interconnection barrier layer;
    forming a seed layer on the liner layer;
    forming an interconnection electrode on the seed layer; and
    forming an interconnection capping layer on the interconnection electrode.

16. A method of manufacturing a semiconductor device, comprising:
    forming a middle interlayer insulating layer over a base structure, the base structure being within a lower interlayer insulating layer;
    etching the middle interlayer insulating layer to form (i) a via hole extending through the middle interlayer insulating layer to expose the base structure, and (ii) an interconnection trench aligned over the via hole so as to form opposing steps in conjunction with the via hole;
    forming a via plug filling the via hole without forming a seed layer in the via hole;
    forming a barrier layer on a bottom of the interconnection trench, the opposing steps, and at least an uppermost portion of inner walls of the via hole; and
    sequentially forming a liner layer, a seed layer, an interconnection electrode and an interconnection capping layer, the liner layer, the seed layer, the interconnection electrode and the interconnection capping layer collectively filling the interconnection trench.

17. The method of claim 16, wherein the forming the barrier layer includes not forming the barrier layer on a remaining portion of the inner walls of the via hole.

18. The method of claim 16, wherein:
the forming the via plug includes performing a chemical vapor deposition process, and
the forming the interconnection electrode includes performing a plating process.

19. The method of claim 16, wherein
the forming the barrier layer includes performing a self-forming process, the self-forming process including not forming the barrier layer on an upper surface of the base structure.

20. The method of claim 16, wherein
the forming the barrier layer is performed after the forming the via plug, and
the barrier layer contacts an upper surface of the via plug.

* * * * *